US012698201B2

(12) United States Patent
Hsieh et al.

(10) Patent No.: US 12,698,201 B2
(45) Date of Patent: Aug. 4, 2026

(54) SEMICONDUCTOR STRUCTURE AND MANUFACTURING METHOD FOR THE SAME

(71) Applicant: TAIWAN SEMICONDUCTOR MANUFACTURING COMPANY LTD., Hsinchu (TW)

(72) Inventors: Yuan-Chih Hsieh, Hsinchu City (TW); Hung-Hua Lin, Taipei City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1001 days.

(21) Appl. No.: 17/811,893

(22) Filed: Jul. 12, 2022

(65) Prior Publication Data

US 2022/0340413 A1 Oct. 27, 2022

Related U.S. Application Data

(62) Division of application No. 16/666,116, filed on Oct. 28, 2019, now Pat. No. 11,634,318.

(51) Int. Cl.
B81B 7/00 (2006.01)
B81B 7/02 (2006.01)
B81C 1/00 (2006.01)

(52) U.S. Cl.
CPC .............. B81B 7/0038 (2013.01); B81B 7/02 (2013.01); B81C 1/00269 (2013.01);
(Continued)

(58) Field of Classification Search
CPC . B81B 7/0038; B81B 7/02; B81B 2201/0235; B81B 2201/0242; B81C 1/00269; B81C 1/00285; B81C 2203/0109
See application file for complete search history.

(56) References Cited

U.S. PATENT DOCUMENTS

2015/0360939 A1 12/2015 Zhang et al.
2016/0039666 A1 2/2016 Zhang et al.
(Continued)

FOREIGN PATENT DOCUMENTS

CN 106976838 A 7/2017
CN 107032290 A 8/2017
(Continued)

OTHER PUBLICATIONS

U.S. Pat. No. 9,884,758 B2 is the US counterpart of CN 106976838 A.

(Continued)

*Primary Examiner* — Marcos D. Pizarro
(74) *Attorney, Agent, or Firm* — WPAT LAW; Anthony King

(57) ABSTRACT

The present disclosure provides a micro electro mechanical system (MEMS) structure, including a device substrate having a first region and a second region different from the first region, a capping substrate bonded over the device substrate, a first cavity in the first region and between the device substrate and capping substrate, wherein the first cavity has a first cavity pressure, a second cavity in the second region and between the device substrate and capping substrate, wherein the second cavity has a second cavity pressure lower than the first cavity pressure, an outgassing material, wherein the outgassing material includes a top surface and a sidewall exposed to the first cavity, the outgassing material is free from being in direct contact with the capping substrate, wherein the outgassing material includes a trench, and a passivation layer disposed over the device substrate, and is in direct contact with the outgassing material.

20 Claims, 23 Drawing Sheets

(52) U.S. Cl.
CPC .. _B81C 1/00285_ (2013.01); _B81B 2201/0235_ (2013.01); _B81B 2201/0242_ (2013.01); _B81C 2203/0109_ (2013.01)

(56) References Cited

U.S. PATENT DOCUMENTS

| | | | |
|---|---|---|---|
| 2017/0210619 A1* | 7/2017 | Chang | B81C 1/00269 |
| 2018/0222750 A1 | 8/2018 | Liu et al. | |
| 2018/0312396 A1* | 11/2018 | Lee | B81C 1/00285 |

FOREIGN PATENT DOCUMENTS

| | | |
|---|---|---|
| CN | 110034122 A | 7/2019 |
| TW | 201529465 A | 8/2015 |
| TW | 201727780 A | 8/2017 |

OTHER PUBLICATIONS

US 2015/0210541 A1 is the US counterpart of TW 201529465 A.
U.S. Pat. No. 9,884,758 B2 is the US counterpart of TW 201727780 A.
U.S. Pat. No. 9,926,190 B2 is the US counterpart of CN 107032290 A.
U.S. Pat. No. 10,510,696 B2 is the US counterpart of CN110034122 A.
Office Action dated Jan. 14, 2026 issued by the USPTO for the Counterpart U.S. Appl. No. 18/302,775.

* cited by examiner

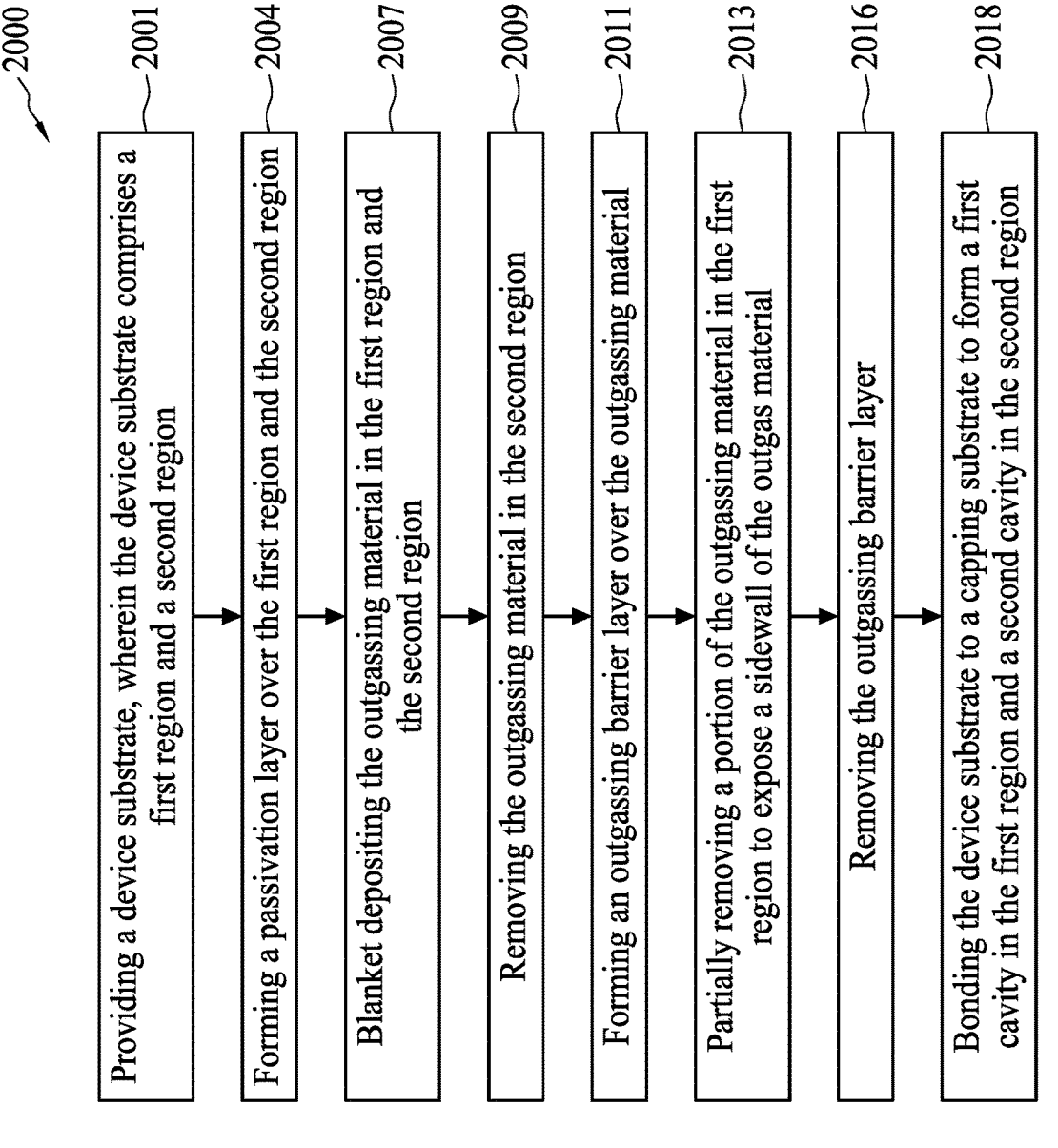

2001 — Providing a device substrate, wherein the device substrate comprises a first region and a second region 2004 — Forming a passivation layer over the first region and the second region 2007 — Blanket depositing the outgassing material in the first region and the second region 2009 — Removing the outgassing material in the second region 2011 — Forming an outgassing barrier layer over the outgassing material 2013 — Partially removing a portion of the outgassing material in the first region to expose a sidewall of the outgas material 2016 — Removing the outgassing barrier layer 2018 — Bonding the device substrate to a capping substrate to form a first cavity in the first region and a second cavity in the second region

FIG. 4

SEMICONDUCTOR STRUCTURE AND MANUFACTURING METHOD FOR THE SAME

CROSS REFERENCE TO RELATED APPLICATIONS

This application is a divisional application of prior-filed U.S. application Ser. No. 16/666,116, filed Oct. 28, 2019.

BACKGROUND

Micro-electromechanical system (MEMs) refers to a class of devices exhibiting mechanical characteristics such as having features capable of moving or deforming. A MEMS device may include mechanical element and/or electronics for sensing.

Micro-electromechanical system devices, such as pressure sensors, gyroscopes, accelerometers, position sensors, etc., are widely used in many modern day electronic devices. For example, MEMs accelerometers can be commonly found in mobile devices, automobiles (e.g. in airbag deployment systems), tablet computers, or consumer's devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B shows a flow chart representing a method for fabricating a micro-electromechanical system structure, in accordance with some embodiments of the present disclosure.

FIG. 4 to FIG. 12 are cross sectional views of a micro-electromechanical system structure during intermediate stages of manufacturing operations, according to some embodiments of the present disclosure.

DETAILED DESCRIPTION

Figure 1:
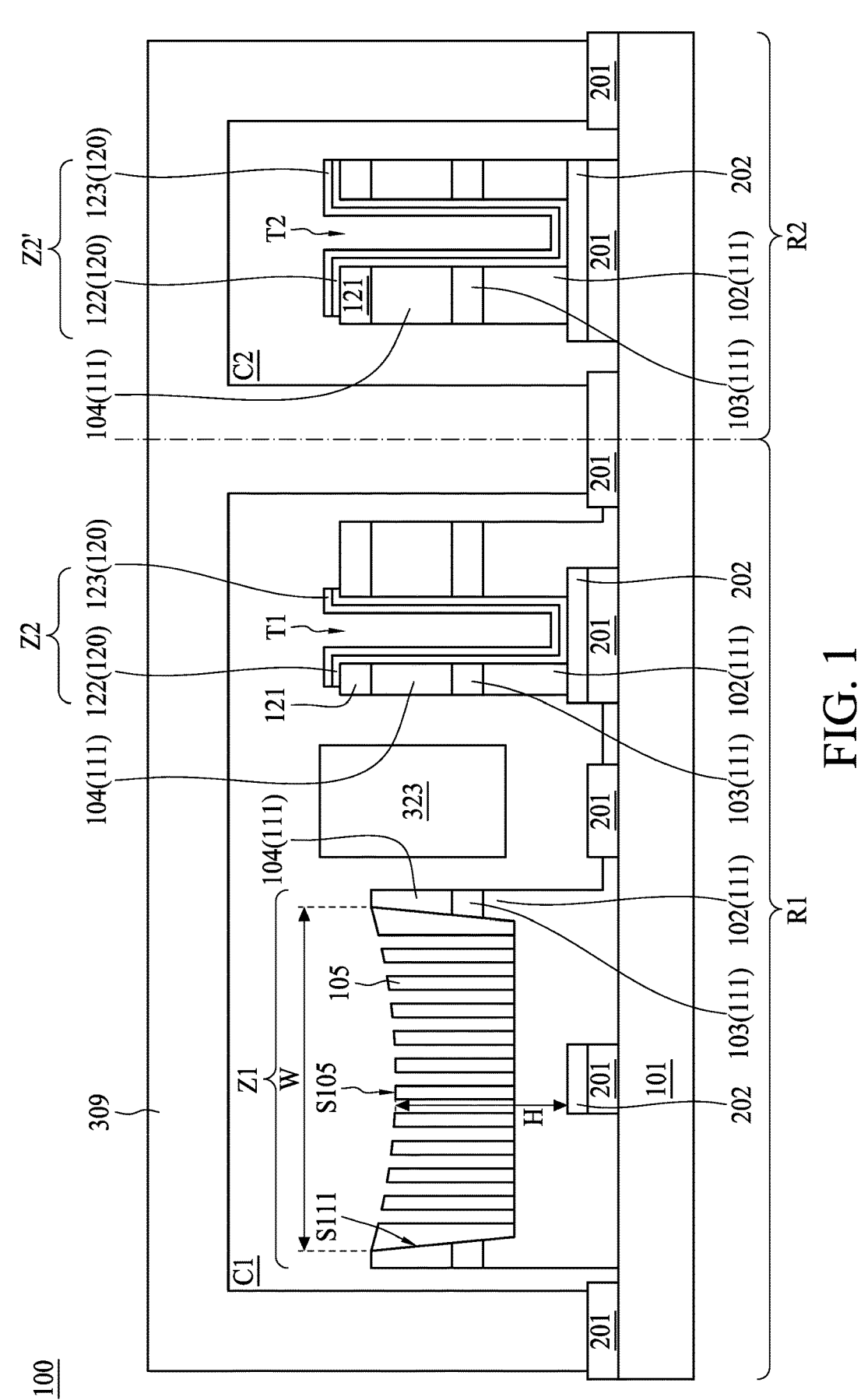
FIG. 1 is a cross sectional view of a micro-electromechanical system structure, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Microelectromechanical system (MEMs) device are widely used, for example, pressure sensors are used to detect pressure, and motion sensors are used for motion-activated user interfaces in consumer electronics such as smartphones, tablets, gaming consoles, smart-TVs, and in automotive crash detection systems. In order to enable a chip to have multiple functions, multiple MEMs devices may be integrated onto one integrated chip in recent generations of MEMs integrated circuits. Specifically, to capture more precise and complete movements within a three-dimensional space, motion sensors often utilize an accelerometer and a gyroscope in combination. To meet consumer demand for low cost, high quality, and small device footprint, the accelerometer and the gyroscope can be incorporated into a same chip.

However, different MEMs devices are often operated under different cavity pressures. For example, in the case of a gyroscope device, a relatively lower cavity pressure (i.e., a higher vacuum level) is desirable since it may provide a better measurement of displacement which is converted to signal. Conversely, in the case of an accelerometer device, a relatively higher cavity pressure is desirable since air-damping may be utilized to improve the reliability of movable components (such as proof mass) in the accelerometer. Therefore, MEMs devices typically entail a sealed chamber that is held at a controlled pressure level that enables optimized operation of the device. The pressure level of each device can range from a vacuum (e.g., 0.001 millibar or even lower) to a certain degree of pressure depending on the device type. In order to achieve a required reference pressure in a cavity of a device, sealing techniques can be performed to seal the cavity. Furthermore, in order to increase the pressure in cavities which requires a higher cavity pressure, an outgassing material can be incorporated into the predetermined cavity to individually increase the cavity pressure therein.

However, a challenge with forming a MEMs structure with several cavities requiring different cavity pressure is the performance of the device requiring higher cavity pressure. For example, the outgassing material in selected cavities may not generate enough outgassing gas. When the cavity pressure of the MEMs accelerometer is too low, the performance of sensing its motions and/or reliability may be deteriorated. It is arduous to integrate device(s) requiring higher cavity pressure and device(s) requiring higher vacuum level on the same integrated chip.

The present disclosure provides a MEMs structure and a method for fabricating a MEMs structure to improve outgassing capability of outgassing material in selected cavities so as to increase the cavity pressure in the selected cavities. Integration of different devices with different cavity pressure requirements on an integrated chip can be achieved.

Referring to FIG. 1, FIG. 1 is a cross sectional view of a micro-electromechanical system structure, according to some embodiments of the present disclosure. A MEMs structure 100 at least includes a device substrate 101, a capping substrate 309 and an outgassing material 105. The device substrate 101 includes a first region R1 and a second region R2 different from the first region R1. In some embodiments, the device substrate 101 further includes inter-metal dielectric (IMD) material at its top surface. The capping substrate 309 is bonded to the device substrate 101, thereby having a first cavity C1 and a second cavity C2 between the device substrate 101 and the capping substrate 309, wherein the first cavity C1 is in the first region R1, and the second cavity C2 is in the second region R2. The first cavity C1 has a first cavity pressure, and the second cavity C2 has a second cavity pressure lower than the first cavity pressure.

Bonding in the present disclosure may be referred to methods of attaching substrates, including but not limited to eutectic bond (e.g. CuSn, AlGe, AuSi), fusion bond, thermocompression, or any other suitable wafer-level bonding. In some embodiments, a plurality of top metal lines 201 are at the bonding areas between the device substrate 101 and the capping substrate 309, wherein the top metal lines 201 include conductive materials, such as aluminum copper, aluminum, copper, tin, gold, combination thereof, or other metal or metal alloy suitable for bonding. In some embodiments, the MEMs structure 100 may further include a titanium layer 202 above the top metal lines 201 not directly between the device substrate 101 and the capping substrate 309 (which is not at the bonding areas). In some embodiments, the titanium layer 202 may optionally include silicon oxynitride (SiON) layer. In some other embodiments, the titanium layer 202 can optionally be substituted by a titanium nitride (TiN) layer.

A device substrate may refer to substrate with circuits, semiconductor devices, and/or semiconductor structures, such as accelerometer, gyroscope, barometer, magnetometer, position sensors, et cetera. For example, the MEMs structure 100 may include a combination of accelerometer and gyroscope, and such MEMs structure 100 can be incorporated in 6-axis device. However the present disclosure is not limited thereto, for example, such MEMs structure 100 may also be incorporated in 7-axis device, 9-axis device, or the like. For example, an accelerometer is disposed in the first region R1 and a gyroscope is disposed in the second region R2, and the second cavity pressure is lower than the first cavity pressure. In some of the embodiments, the second cavity pressure is at a high vacuum level. In some embodiments, the accelerometer may include a movable component 323 in the first cavity C1, for example, the movable component 323 can be a proof mass restricted in the first cavity C1, where its movement within the first cavity C1 is utilized to measure acceleration.

The MEMs structure 100 may include a passivation layer 111 in the first region R1 and the second region R2. In some of the embodiments, the passivation layer 111 may include multiple layers, for example, a first passivation layer 102 over the device substrate 101 and surrounding some of the top metal lines 201, a second passivation layer 103 over the first passivation layer 102, and a third passivation layer 104 over the second passivation layer 103. In some embodiments, the first passivation layer 102 includes plasma enhanced oxide (PEOX), the second passivation layer 103 may include silicon-rich oxide, the third passivation layer 104 includes silicon nitride (SiN), but the present disclosure is not limited thereto. In some other alternative embodiments, the passivation layer 111 may include one material. In some other alternative embodiments, the passivation layer 111 may include other combination of a plurality of passivation materials.

The MEMs structure 100 may include an outgassing region Z1 and a first rerouting region Z2 in the first cavity C1, and a second rerouting region Z2' in the second cavity C2. An outgassing barrier layer 121 is formed above the passivation layer 111 in the first rerouting region Z2 and the second rerouting region Z2'. In some embodiments, the outgassing barrier layer 121 may include silicon nitride (SiN), or the like. A trench T1 and a trench T2 respectively penetrate the passivation layer 111 and the outgassing barrier layer 121 in the first rerouting region Z2 and the second rerouting region Z2'. A rerouting layer 120 may be directly contacted and surrounded by a sidewall of the trench T1 in the first rerouting region Z2 and the trench T2 in the second rerouting region Z2', wherein the rerouting layer 120 includes one or more conductive materials, such as metal. For example, the rerouting layer 120 may include a first layer 122 over the outgassing barrier layer 121 and directly contacting with sidewalls of the trench T1 and the trench T2, and a second layer 123 over the first layer 122. In some of the embodiments, the first layer 122 includes titanium. In some of the embodiments, the second layer includes titanium nitride. In some embodiments, the MEMs structure 100 may optionally further include other semiconductor structures, such as fins or passivation structures. In some embodiments, such semiconductor structures may include the passivation layer 111 (as previously discussed, in some of the embodiments, which may include the first passivation layer 102 over the device substrate 101, the second passivation layer 103 over the first passivation layer 102, and the third passivation layer 104 over the second passivation layer 103), and the outgassing barrier layer 121 capping over a top surface of the passivation layer 111. The position of such semiconductor structures may be outside of the first cavity C1 and the second cavity C2, or alternatively in one of the first cavity C1 and the second cavity C2.

The MEMs structure 100 at least includes the passivation layer 111 and an outgassing material 105 over the passivation layer 111 in the outgassing region Z1. The outgassing material 105 includes a material capable of generating substantial outgassing gas after undergoing a temperature for bonding the device substrate 101 and the capping substrate 309 (which will be discussed in FIG. 15). For example, a cavity pressure in a range from about 0.001 mbar to about 2 mbar can be increased to be in a range from about 10 mbar to about 300 mbar by utilizing outgassing material 105, which can be deemed as a result of "generating substantial outgassing gas" in the present disclosure. It is understood that the rate of generating outgassing gas at a first type eutectic bonding temperature, for example, about 260 degree Celsius for Cu—Sn, Al—Sn, or Au—Sn, is lower than the rate at the temperature for a second type eutectic bonding temperature, for example, about 420 degree Celsius for Al—Ge. Outgassing material 105 to be adopted in the present disclosure may depend on the eutectic bonding temperature used in the operation of bonding the device substrate 101 and the capping substrate 309.

The outgassing material 105 may include high density plasma oxide (HDP oxide, such as silicon oxide formed by a high-density plasma tool), plasma enhanced oxide, polymer, polysilicon, amorphous silicon, polyimide, organic compound, oxide compound, poly (para-xylylene) derivatives, or other suitable outgassing dielectric material. In some embodiments, the outgassing gas may include hydrogen ($H_2$), Argon (Ar), and/or other type of gas generated from the aforementioned outgassing material 105, depending on the type of material. Bonding in the present disclosure may be referred to methods of attaching substrates, including but not limited to eutectic bond (e.g. CuSn, AlGe, AuSi), fusion bond, thermo-compression, or any other suitable wafer-level bonding. For example, during an operation of a CuSi bond, the MEMs structure 100 may be heated to from about 200° C. to about 300° C.; during an operation of a AlGe eutectic bond, the MEMs structure 100 may be heated to from about 420° C. to about 440° C.; during an operation of a AuSi bond, the MEMs structure 100 may be heated to from about 360° C. to about 380° C. Thus, the choice of the type of the outgassing material 105 can be adjusted based on the requirement temperature of a bonding operation of the device substrate 101 and the capping substrate 309.

The MEMs structure 100 may optionally further include a top metal line 201 surrounded by the passivation layer 1i1 and under the outgassing material 105. In some embodiments, the MEMs structure 100 may further include a titanium layer 202 (or a titanium nitride layer) above such top metal line 201. In some embodiments, the titanium layer 202 may optionally include a silicon oxynitride (SiON) layer. In some embodiments, a top surface S105 of the outgassing material 105 may concave toward the device substrate 101. In some embodiments, a thickness H between the top surface S105 of the outgassing material 105 and a top surface of the titanium layer 202 or the top metal line 201 directly below the outgassing material 105 is in a range from about 0.5 μm to about 10 μm. In some examples, the passivation layer 111 between the outgassing material 105 and the titanium layer 202 is about 3400 Angstrom. In some embodiments, a width of the outgassing material 105 is in a range from about 10 μm to about 2,000 μm, which may provide adequate amount of outgassing gas during outgassing operations while tallying with device minimization trend. In some embodiments, the passivation layer 111 has a recess recessed from a top surface, and the outgassing material 105 is filled in the recess of the passivation layer 111, and exposed to the first cavity C1 from the passivation layer 111. Alternatively stated, the passivation layer 111 has an inner sidewall S111, and the outgassing material 105 is laterally surrounded by the inner sidewall S111 of the passivation layer 111. In some embodiments, the bottom surface of the recess is below the top surface of the first passivation layer 102. Furthermore, in some embodiments, an inner sidewall of the outgassing material 105 is exposed to the first cavity C1, as various different embodiments of the outgassing material 105 will be subsequently discussed in FIG. 2A to FIG. 2F. In some of the embodiments, such structure stems from the outgassing material 105 being partially removed during fabrication operations, wherein the outgassing material 105 being partially removed may have a greater total surface area exposed to the cavity C1 comparing to not being partially removed.

Figure 2A:
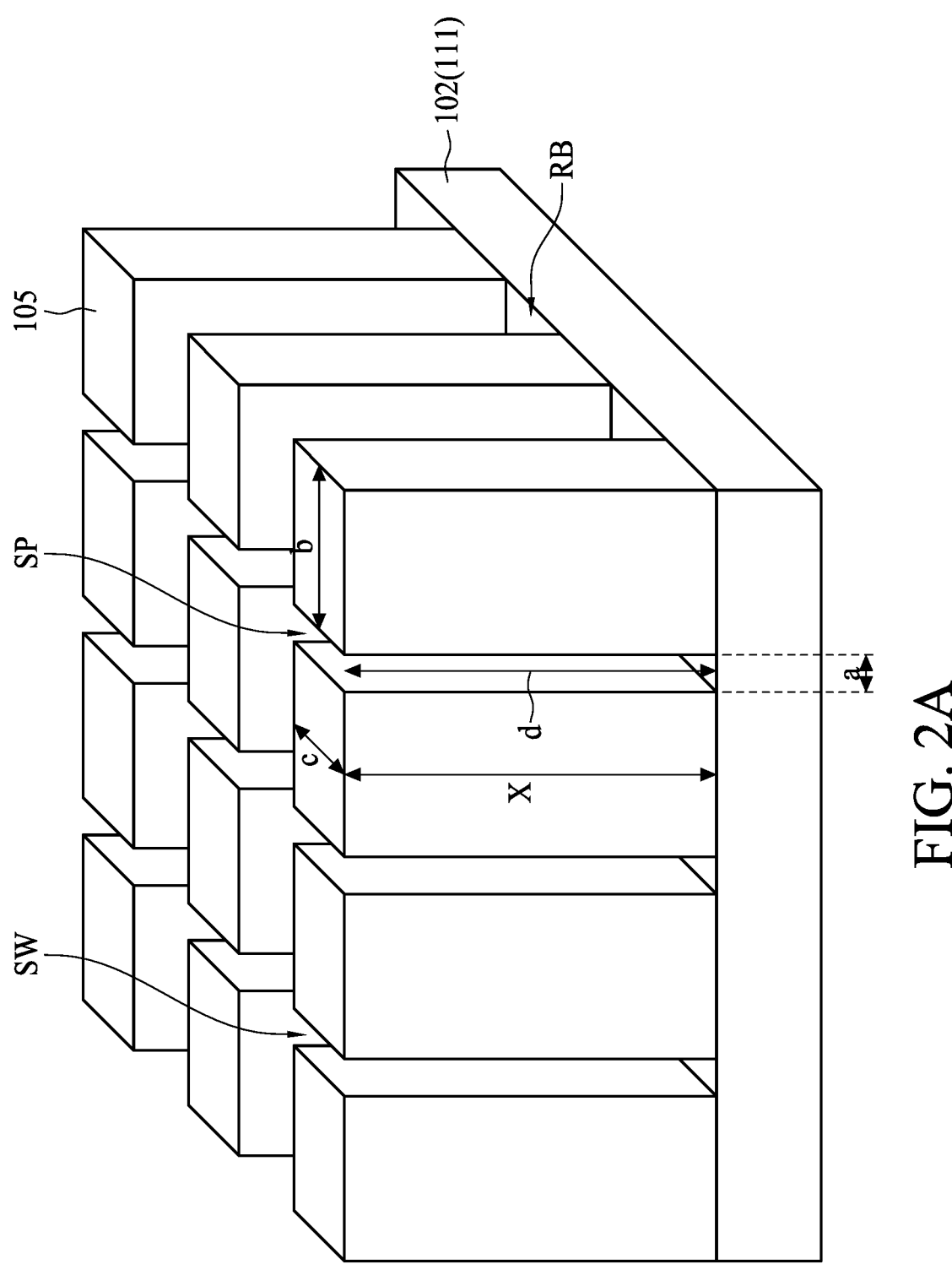
FIG. 2A is a perspective view of a portion of an outgassing material and a portion of the passivation layer, according to some embodiments of the present disclosure.

Referring to FIG. 2A, FIG. 2A is a perspective view of a portion of an outgassing material and a portion of the passivation layer, according to some embodiments of the present disclosure. In some embodiments, a plurality of blocks of outgassing material 105 is separated from each other. A depth d of the space SP between two blocks of the outgassing material 105 is identical with a thickness X of the outgassing material 105 (that is, d=1.0*X), and a bottom surface RB of the recess is exposed to the first cavity C1. Alternatively stated, a surface of the passivation layer 111 (or specifically in some embodiments, a surface of the first passivation layer 102) is exposed to the first cavity C1 from the outgassing material 105. Furthermore, a sidewall SW of the outgassing material 105 is exposed to the first cavity C1. In some embodiments, a spacing a between each block of the outgassing material 105 may be in a range from about 0.1 μm to about 20 μm. In some embodiments, a width b of each block of the outgassing material 105 may be in a range from about 0.1 μm to about 20 μm. In some embodiments, a length c of each block of the outgassing material 105 may be in a range from about 0.1 μm to about 20 μm. A thickness X of the outgassing material 105 (as well as a depth d of the space SP in the embodiments of FIG. 2A) is greater than or equal to 0.1 μm. In some of the embodiments, the thickness X of the outgassing material 105 is less than or equal to 10 μm. It should be noted that the sidewall SW of the outgassing material 105 is not limited to vertical sidewall, that is, slanted sidewalls or curved sidewalls are also included in the present disclosure.

Figure 2B:
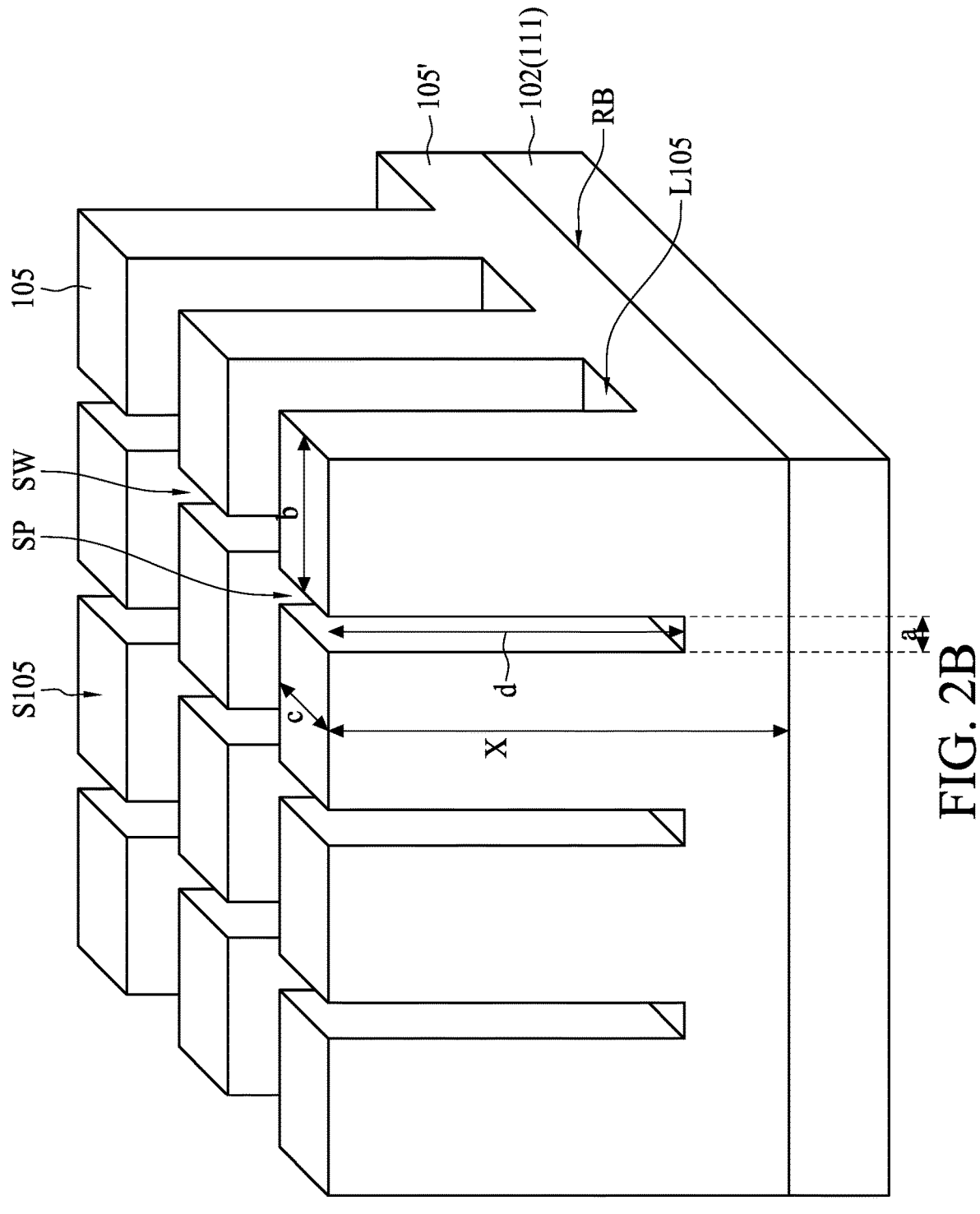
FIG. 2B is a perspective view of a portion of an outgassing material and a portion of the passivation layer, according to some embodiments of the present disclosure.

Referring to FIG. 2B, FIG. 2B is a perspective view of a portion of an outgassing material and a portion of the passivation layer, according to some embodiments of the present disclosure. Alternatively, a depth d of the space SP between two blocks of the outgassing material 105 is less than a thickness X of the outgassing material 105. In some embodiments, the depth d is in a range from about 0.1 times of the thickness X to up to 1.0 times of the thickness X, and a sidewall SW of the outgassing material 105 is exposed to the first cavity C1. Alternatively stated, the outgassing material 105 has a lower surface L105 between the top surface S105 of the outgassing material 105 and the bottom surface RB of the recess, wherein the lower surface L105 is exposed to the first cavity C1. Furthermore, a plurality of blocks of outgassing material 105 is connected by a lower portion 105' of the outgassing material 105, and the passivation layer 111 is not exposed from the outgassing material 105. Herein a spacing a between each block of the outgassing material 105, a width b of each block, and a length c of each block are similar to the embodiments of FIG. 2A, thus duplicated descriptions are omitted. In some embodiments, when the depth d is greater than 0.1 times of the thickness X (or greater than 0.1 μm is some alternative embodiments), the amount of outgassing gas generated by the outgassing material 105 during an interval treated under an elevated temperature is substantially increased.

Figure 2C:
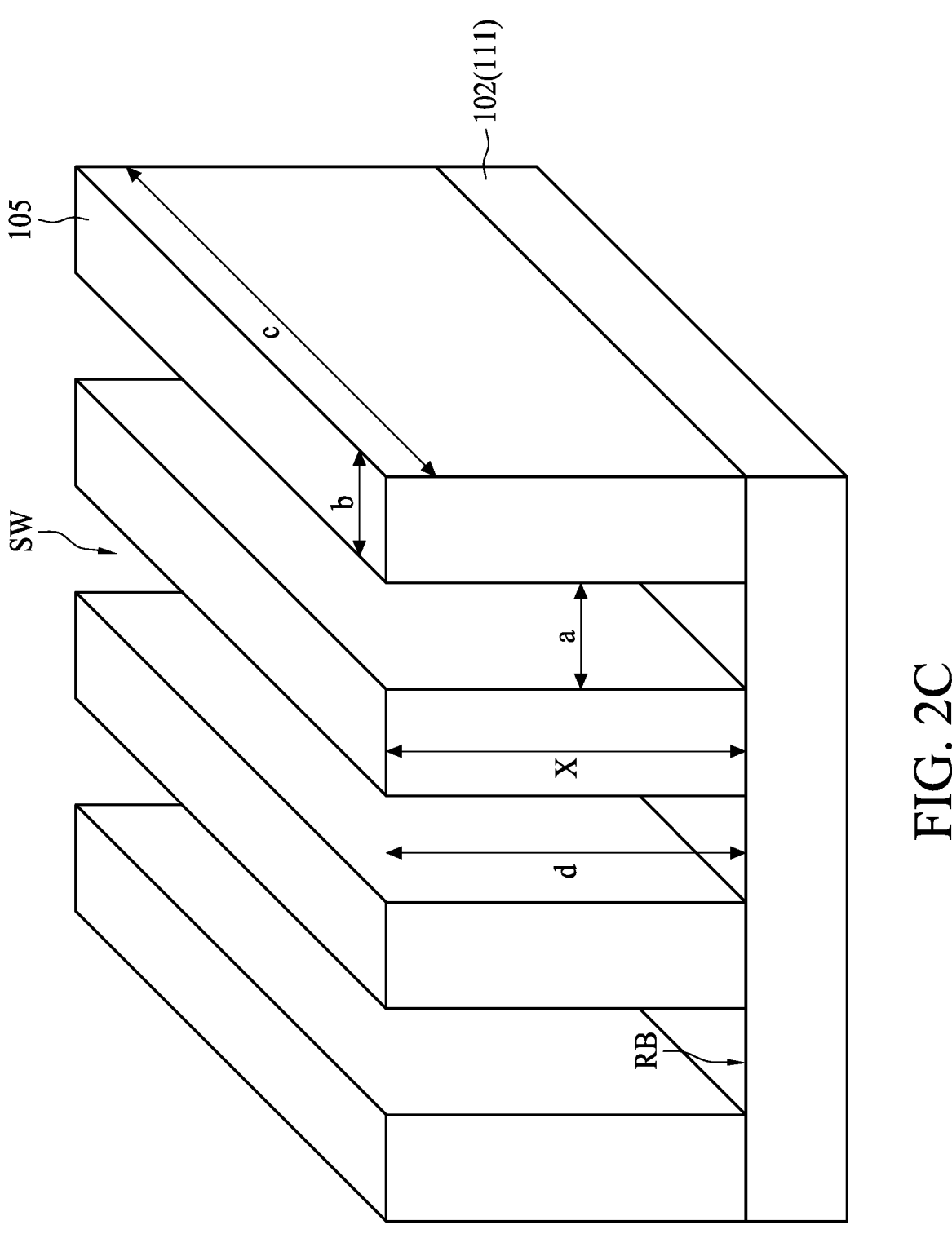
FIG. 2C is a perspective view of a portion of an outgassing material and a portion of the passivation layer, according to some embodiments of the present disclosure.

Referring to FIG. 2C, FIG. 2C is a perspective view of a portion of an outgassing material and a portion of the passivation layer, according to some embodiments of the present disclosure. Alternatively in some embodiments, a plurality of blocks of outgassing material 105 is separated from each other. A depth d of the space SP between two blocks of the outgassing material 105 is identical with a thickness X of the outgassing material 105 (that is, d=1.0*X), and a bottom surface RB of the recess is exposed to the first cavity C1. Alternatively stated, a surface of the passivation layer 111 (or specifically in some embodiments, a surface of the first passivation layer 102) is exposed to the first cavity C1 from the outgassing material 105. Furthermore, a sidewall SW of the outgassing material 105 is exposed to the first cavity C1. Herein a spacing a between each block of the outgassing material 105, a width b of each block, and a length c of each block are similar to the embodiments of FIG. 2A, thus duplicated descriptions or omitted. A length c of each block of the outgassing material 105 may be in a range from about 0.1 μm to a width W (shown in FIG. 1) of the outgassing material 105.

Figure 2D:
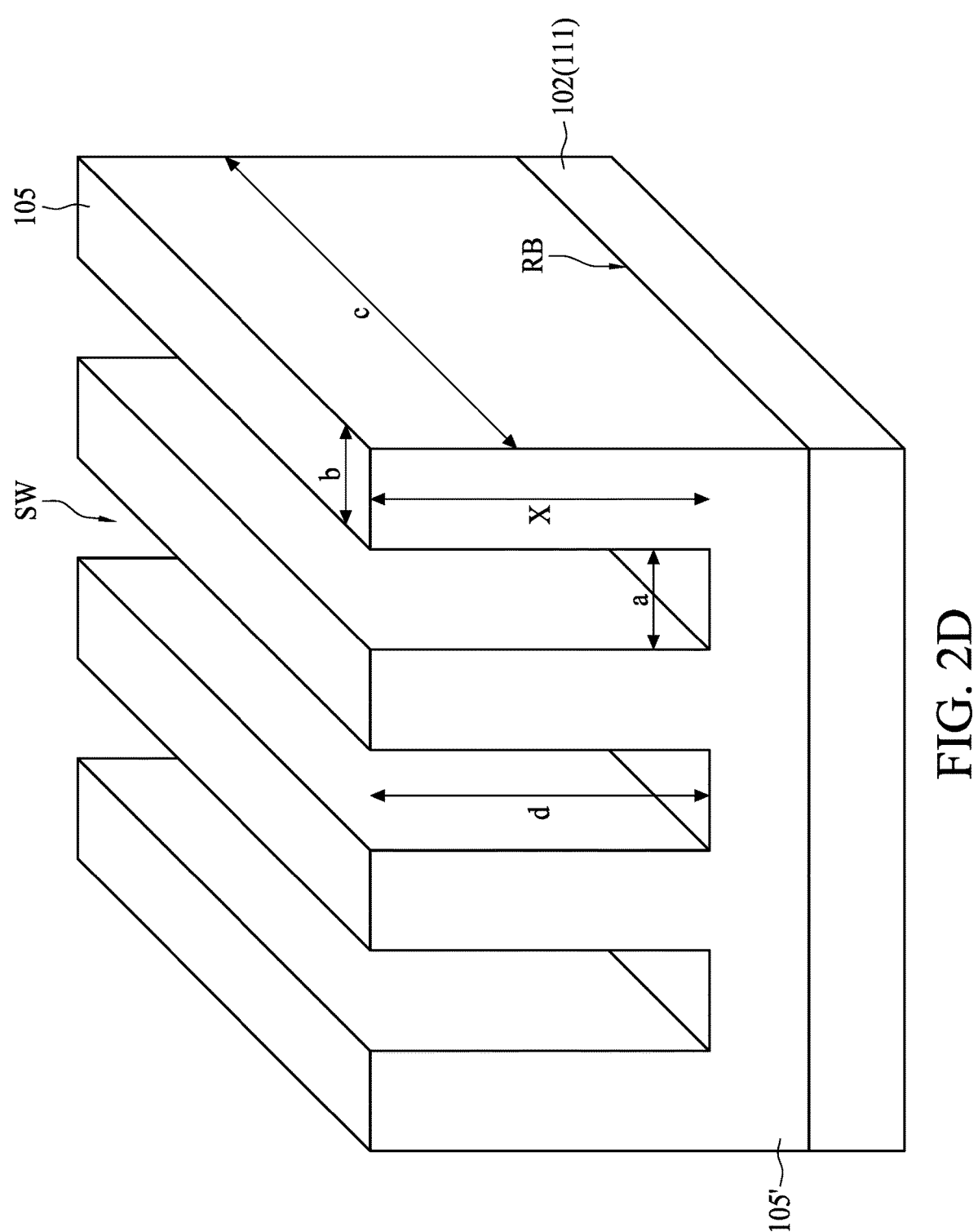
FIG. 2D is a perspective view of a portion of an outgassing material and a portion of the passivation layer, according to some embodiments of the present disclosure.

Referring to FIG. 2D, FIG. 2D is a perspective view of a portion of an outgassing material and a portion of the passivation layer, according to some embodiments of the present disclosure. Alternatively, a depth d of the space SP between two blocks of the outgassing material 105 is less than a thickness X of the outgassing material 105. In some embodiments, the depth d is in a range from about 0.1 times of the thickness X to up to 1.0 times of the thickness X, and a sidewall SW of the outgassing material 105 is exposed to the first cavity C1. Alternatively stated, the outgassing material 105 has a lower surface L105 between the top surface S105 of the outgassing material 105 and the bottom surface RB of the recess, wherein the lower surface L105 is exposed to the first cavity C1. Furthermore, a plurality of blocks of outgassing material 105 is connected by a lower portion 105' of the outgassing material 105, and the passivation layer 111 is not exposed from the outgassing material 105. Herein a spacing a between each block of the outgassing material 105, a width b of each block, and a length c of each block are similar to the embodiments of FIG. 2C, thus duplicated descriptions or omitted. In some embodiments, when the depth d is greater than 0.1 times of the thickness X (or greater than 0.1 μm is some alternative embodiments), the amount of outgassing gas generated by the outgassing material 105 during a period of interval under an elevated temperature is substantially increased.

Figure 2E:
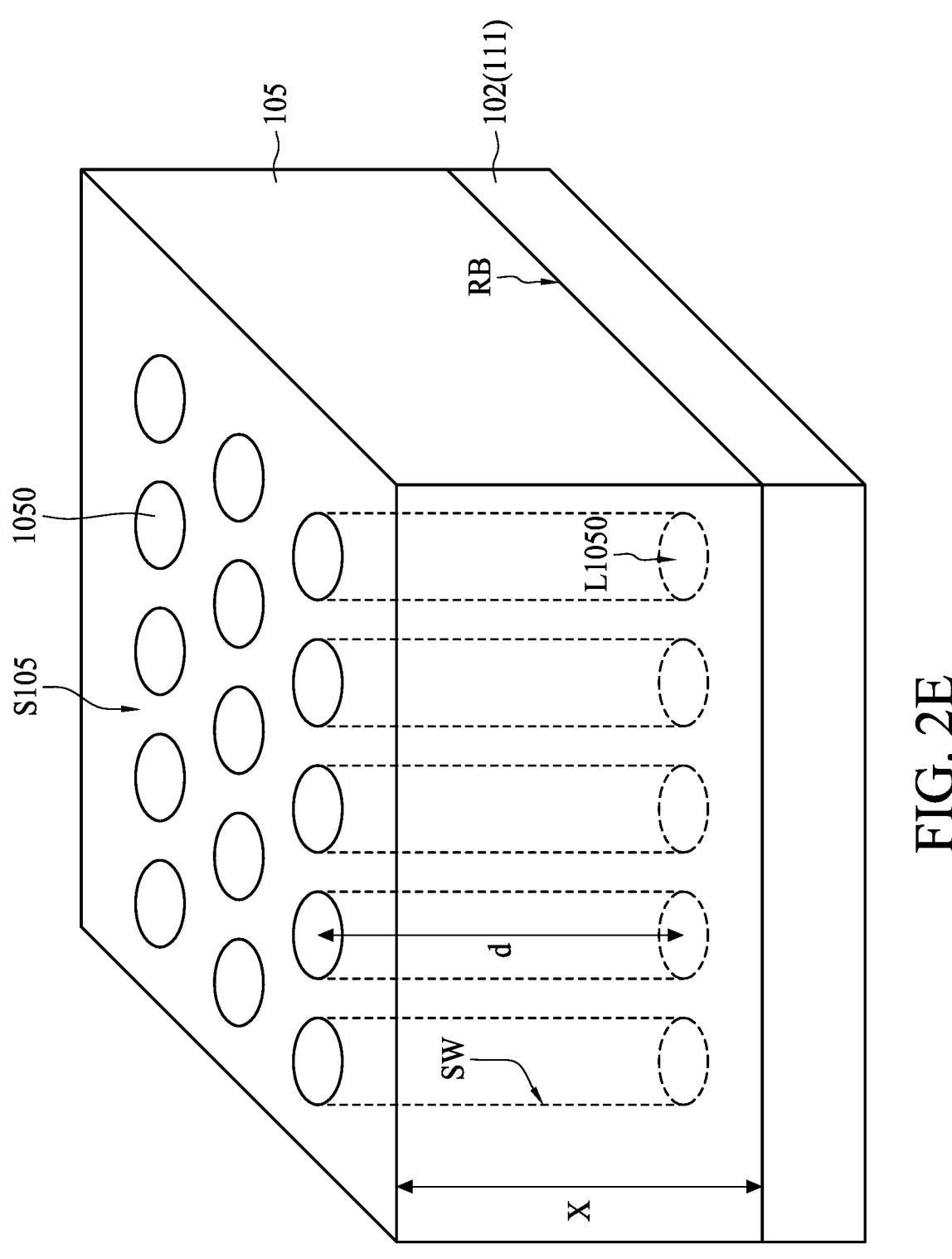
FIG. 2E is a perspective view of a portion of an outgassing material and a portion of the passivation layer, according to some embodiments of the present disclosure.

Referring to FIG. 2E, FIG. 2E is a perspective view of a portion of an outgassing material and a portion of the passivation layer, according to some embodiments of the present disclosure. Alternatively in some embodiments, a plurality of trenches 1050 is recessed from the top surface S105 of the outgassing material 105. Herein a depth of the trench 1050 is in a range from about 0.1 times of the thickness X of the outgassing material 105 to 1.0 times of the thickness X of the outgassing material 105, and a sidewall SW of the trench 1050 is exposed to the first cavity C1. The passivation layer 111 may be exposed from the outgassing material 105 if the depth of the trench 1050 is identical with the thickness X of the outgassing material 105. The passivation layer 111 may be covered by the outgassing material 105 if the depth of the trench 1050 is less than the thickness X of the outgassing material 105, while a bottom surface L1050 of the trench 1050 is exposed to the first cavity C1. It should be noted that each of the trenches 1050 can be identical, or can be different; and the shape of the trenches 1050 are not limited herein, wherein a cross section of the trench 1050 can be circular, polygonal or irregular.

Figure 2F:
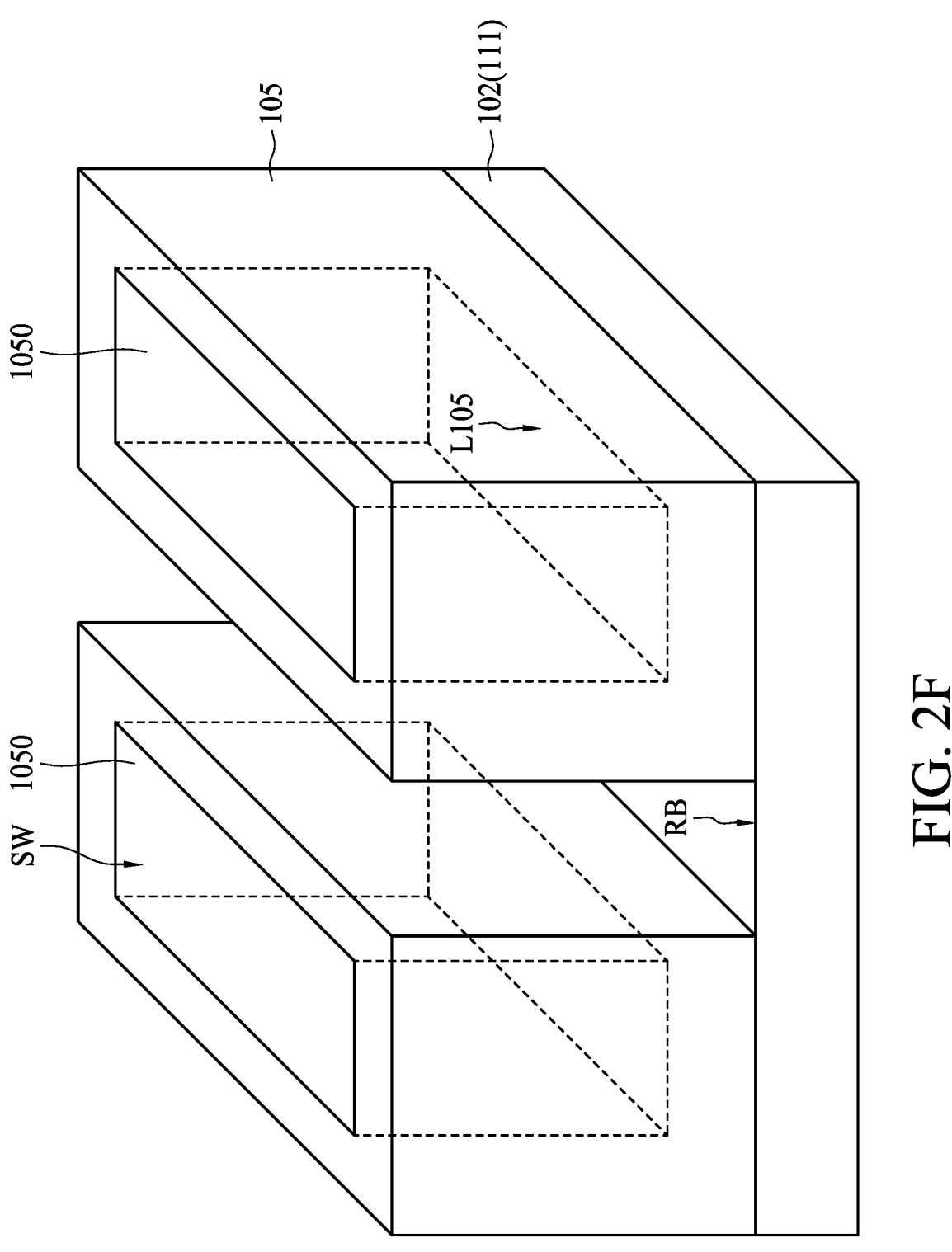
FIG. 2F is a perspective view of a portion of an outgassing material and a portion of the passivation layer, according to some embodiments of the present disclosure.

Referring to FIG. 2F, FIG. 2F is a perspective view of a portion of an outgassing material and a portion of the passivation layer, according to some embodiments of the present disclosure. Alternatively in some embodiments, a top surface of the passivation layer 111 may be partially covered by the outgassing material 105 while partially exposed from the outgassing material 105. The trench 1050 may optionally be formed, wherein sidewall(s) SW of the trench 1050, a portion of the bottom surface RB of the recess and one or more bottom surface L1050 of the trench 1050 are exposed to the first cavity C1.

Figure 3A:
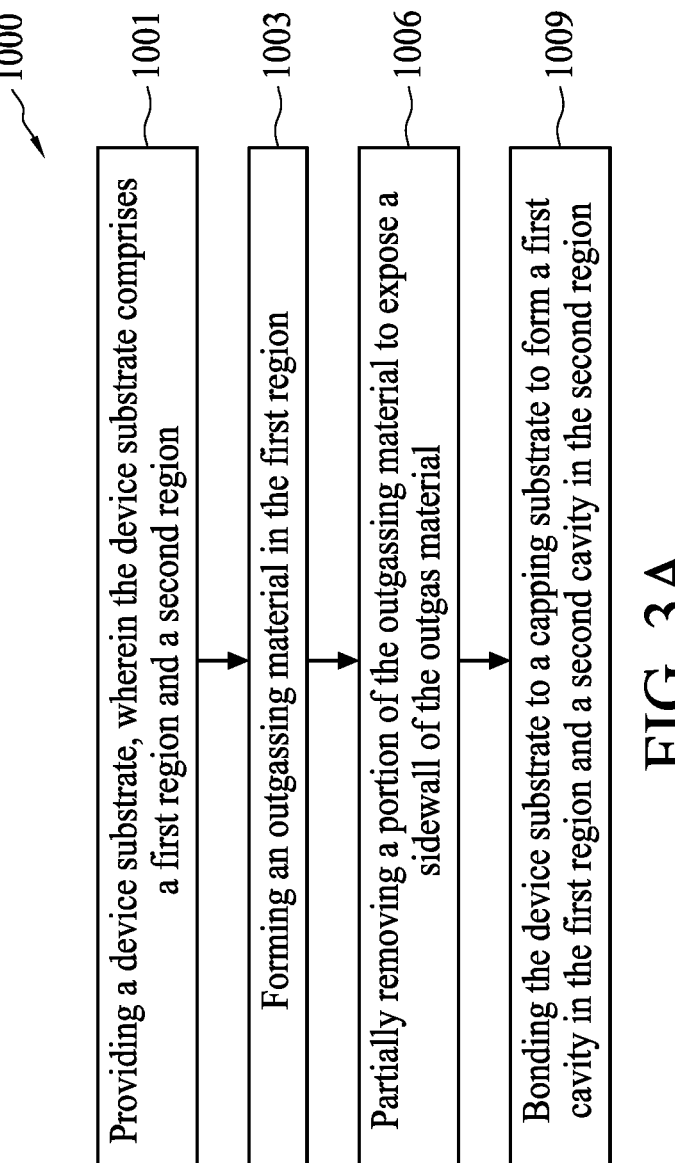
FIG. 3A shows a flow chart representing a method for fabricating a micro-electromechanical system structure, in accordance with some embodiments of the present disclosure.
Figure 13A:
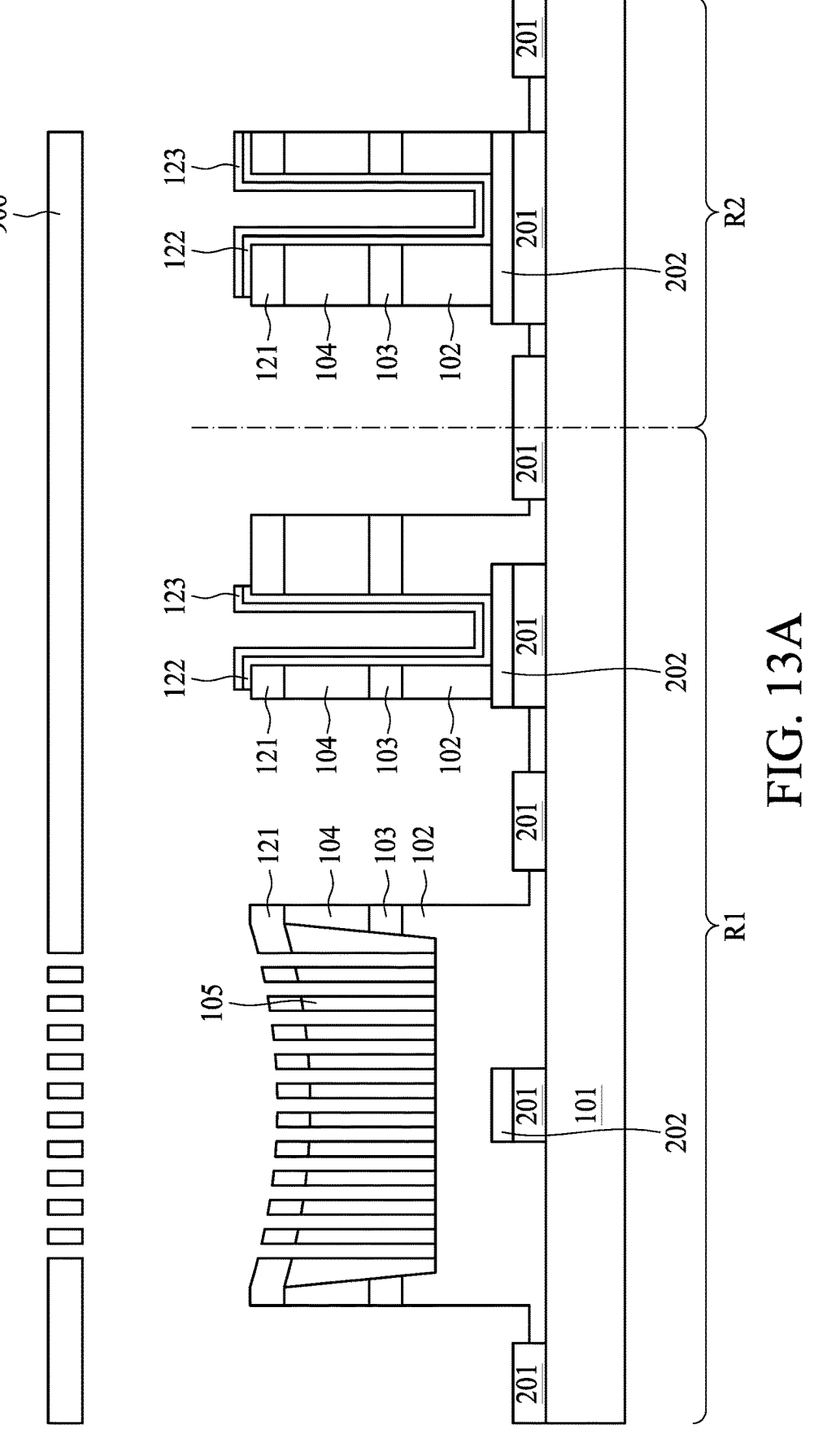
FIG. 13A is a cross sectional view of a micro-electromechanical system structure during intermediate stages of manufacturing operations, according to some embodiments of the present disclosure.

Referring to FIG. 3A, FIG. 3A shows a flow chart representing a method for fabricating a micro-electromechanical system structure, in accordance with some embodiments of the present disclosure. The method 1000 for fabricating a micro-electromechanical system structure includes providing a device substrate, wherein the device substrate comprises a first region and a second region (operation 1001, which can be referred to FIG. 4), forming an outgassing material in the first region (operation 1003, which can be referred to FIG. 5 to FIG. 6), partially removing a portion of the outgassing material to expose a sidewall of the outgas material (operation 1006, which can be referred to FIG. 13A to FIG. 13B or FIG. 13C), and bonding the device substrate to a capping substrate to form a first cavity in the first region and a second cavity in the second region (operation 1009, which can be referred to FIG. 15).

Referring to FIG. 3B, FIG. 3B shows a flow chart representing a method for fabricating a micro-electromechanical system structure, in accordance with some embodiments of the present disclosure. The method 2000 for fabricating a micro-electromechanical system structure includes providing a device substrate, wherein the device substrate comprises a first region and a second region (operation 2001, which can be referred to FIG. 4), forming a passivation layer over the first region and the second region (operation 2004, which can be referred to FIG. 4), blanket depositing the outgassing material in the first region and the second region (operation 2007, which can be referred to FIG. 5), removing the outgassing material in the second region (operation 2009, which can be referred to FIG. 6), forming an outgassing barrier layer over the outgassing material (operation 2011, which can be referred to FIG. 7), partially removing a portion of the outgassing material in the first region to expose a sidewall of the outgas material (operation 2013, which can be referred to FIG. 13A to FIG. 13B or FIG. 13C), removing the outgassing barrier layer (operation 2016, which can be referred to FIG. 14), and bonding the device substrate to a capping substrate to form a first cavity in the first region and a second cavity in the second region (operation 2018, which can be referred to FIG. 15).

Figure 4:
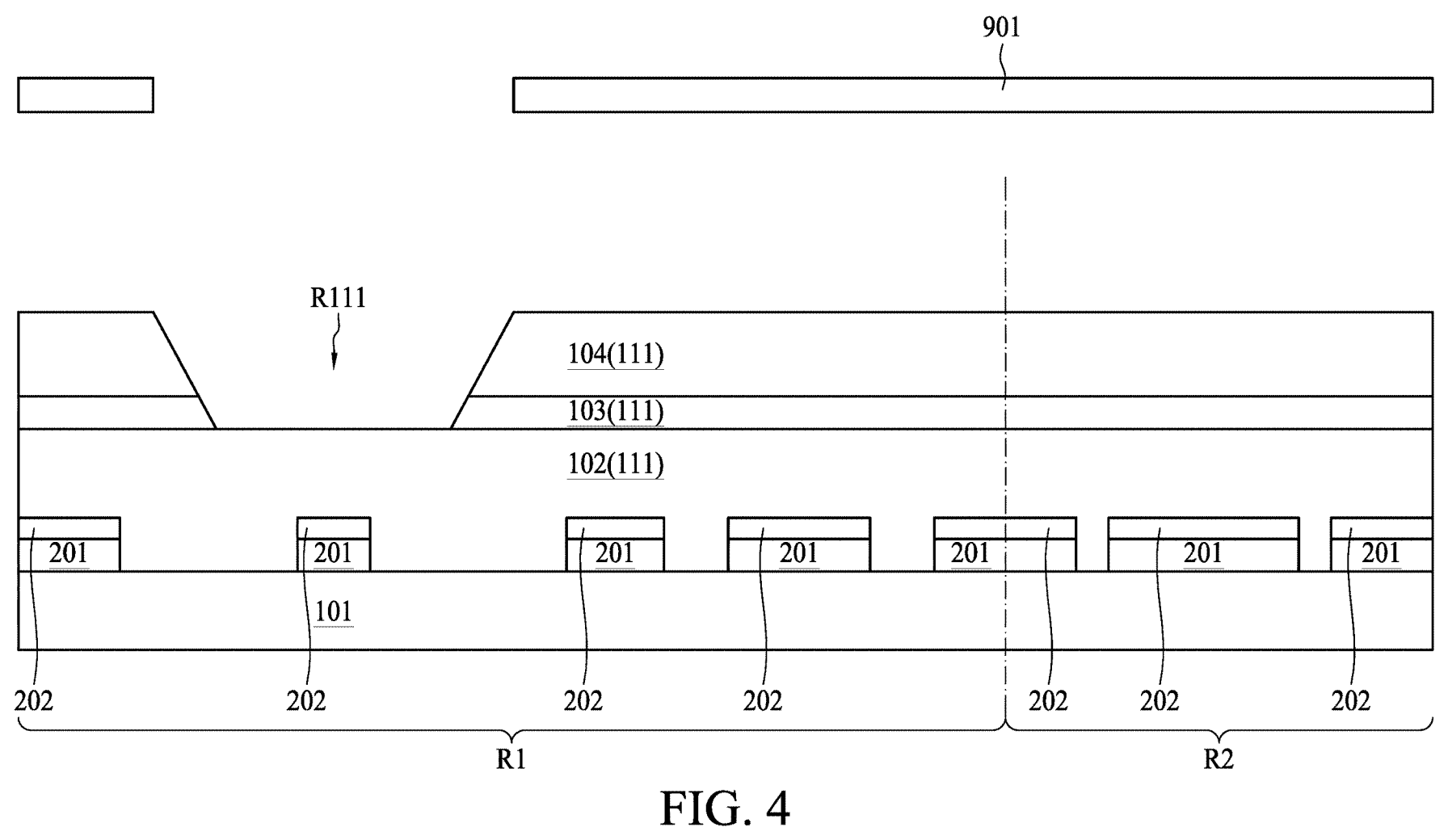

Referring to FIG. 4, FIG. 4 is a cross sectional view of a micro-electromechanical system structure during intermediate stages of manufacturing operations, according to some embodiments of the present disclosure. A device substrate 101 including a first region R1 and a second region R2 different from the first region R1 is provided. A plurality of top metal lines 201 are formed over the device substrate, wherein the top metal lines 201 may include conductive materials, such as aluminum copper, aluminum, copper, tin, gold, combination thereof, or other metal or metal alloy suitable for bonding. In some embodiments, a titanium layer 202 above the top metal lines 201 may be formed above each of the top metal lines 201. In some embodiments, the titanium layer 202 may optionally include a silicon oxynitride (SiON) layer. In some other embodiments, the titanium layer 202 can be substituted by a titanium nitride (TiN) layer.

A passivation layer 111 is further formed in the first region R1 and the second region R2, wherein the passivation layer surrounds and covers above the top metal lines 201 and the titanium layer 202. In some embodiments, the passivation layer 111 may include multiple layers, for example, a first passivation layer 102 over the device substrate 101 and surrounding some of the top metal lines 201, a second passivation layer 103 over the first passivation layer 102, and a third passivation layer 104 over the second passivation layer 103. In some embodiments, the first passivation layer 102 includes plasma enhanced oxide (PEOX), the second passivation layer 103 may include silicon-rich oxide, the third passivation layer 104 includes silicon nitride (SiN), but the present disclosure is not limited thereto. In some other alternative embodiments, the passivation layer 111 may include one material. In some other alternative embodiments, the passivation layer 111 may include other combination of a plurality of passivation materials. Thence a recess R111 recessed from a top surface of the passivation layer 111 is formed. In some embodiments, the recess R111 tapers toward the device substrate 101. In some alternative embodiments, the recess R111 may have a substantially vertical sidewall. In some embodiments, the recess R111 can be formed by using a first mask 901, wherein the partial removal of the passivation layer 111 may entail photolithography operation and/or etching operation. In the aforementioned embodiments of the first passivation layer 102, the second passivation layer 103, and the third passivation layer 104 constituting the passivation layer 111, a bottom surface of the recess R111 is in the first passivation layer 102, wherein the first passivation layer 102 may be partially removed. Optionally, in order to control the amount of passivation layer 1*i*1 to be removed and the depth of the recess R111, end-point detection technique can be utilized. For example, the recess R111 is formed above at least one top metal line 201 and/or one titanium layer 202, wherein a top surface of the titanium layer 202 can be utilized as the reference point of the end-point detection during removing the passivation layer 111. For example, a thickness of the passivation layer 111 is about 10,000 Angstrom, and a distance of the bottom surface of the recess R111 and the top surface of the titanium layer 202 is about 3,400 Angstrom.

Figure 5:
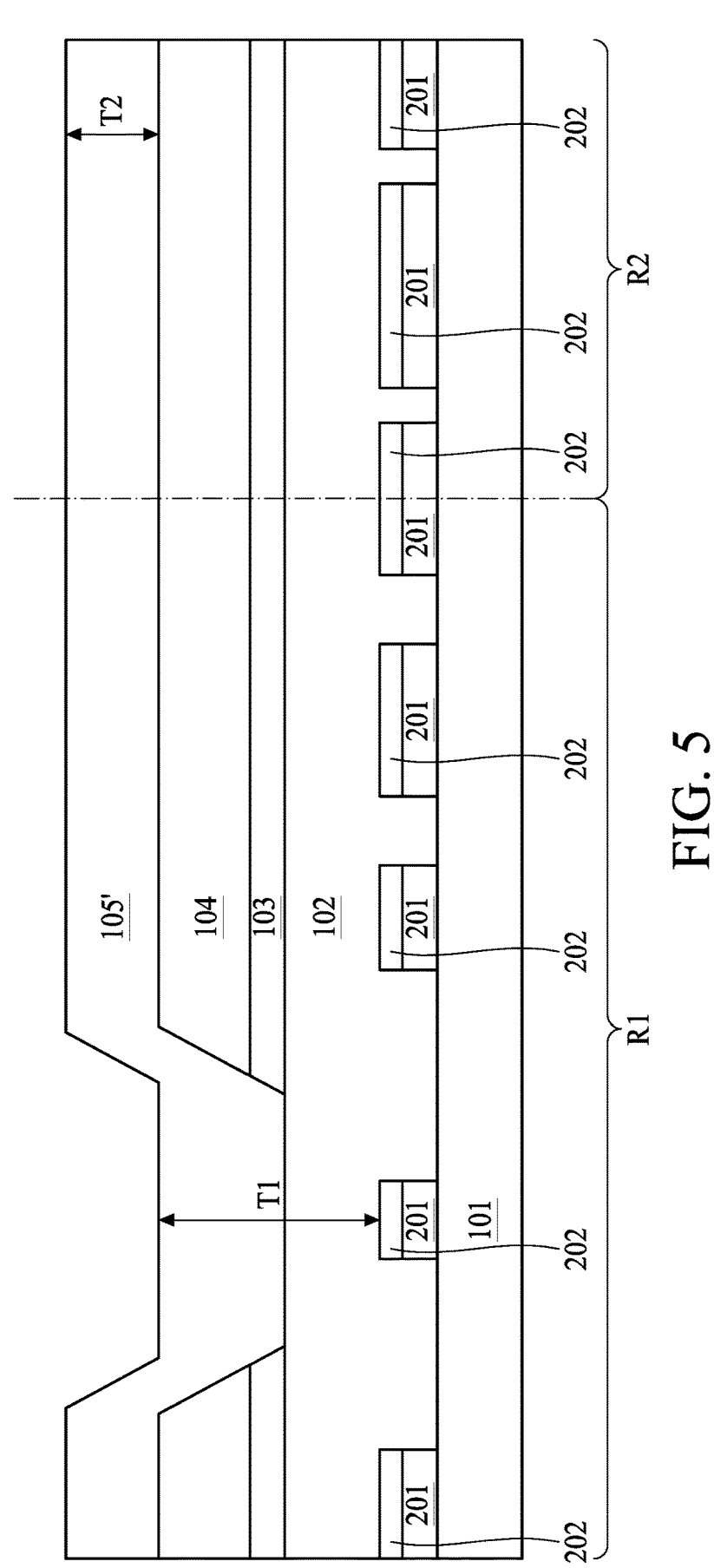

Referring to FIG. 5, FIG. 5 is a cross sectional view of a micro-electromechanical system structure during intermediate stages of manufacturing operations, according to some embodiments of the present disclosure. An outgassing layer 105' is formed over the passivation layer 111 and in the recess R111 by blanket deposition, which covers the first region R1 and the second region R2. For example, a thickness of the formed outgassing layer 105' is about 10,500 Angstrom, and a distance between the top surface of the titanium layer 202 and a top surface of the outgassing layer 105' directly above the recess R111 is in a range from about 12,000 Angstrom to about 16,000 Angstrom. As previously discussed in FIG. 1, the outgassing layer 105' may include high density plasma oxide (HDP oxide, such as silicon oxide formed by a high-density plasma tool), plasma enhanced oxide, polymer, polysilicon, amorphous silicon, polyimide, organic compound, oxide compound, poly (para-xylylene) derivatives, or other suitable outgassing dielectric. In some embodiments, during the operation of depositing outgassing layer 105', for example an HDP oxide layer, silane (SiH$_4$), oxygen (O$_2$), and/or Argon (Ar) or other suitable reaction gas may be supplied.

Figure 6:
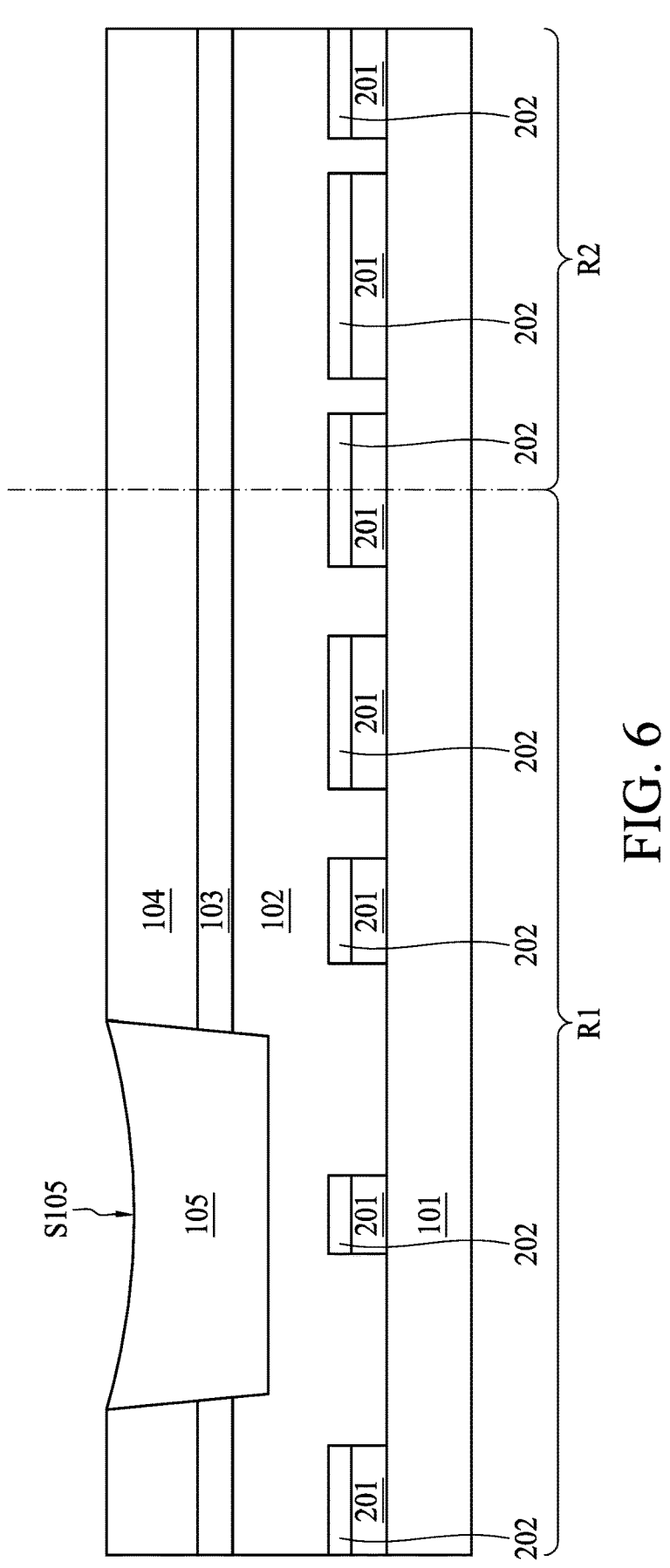

Referring to FIG. 6, FIG. 6 is a cross sectional view of a micro-electromechanical system structure during intermediate stages of manufacturing operations, according to some embodiments of the present disclosure. Subsequently, a chemical-mechanical planarization (CMP) operation is performed from the top surface of the outgassing layer 105' to remove the outgassing layer 105' outside of the recess R111, and a top surface of the passivation layer 111 (or a top surface of the third passivation layer 104) is exposed. After performing the CMP operation, a distance between the top surface of the titanium layer 202 and a top surface of the outgassing material 105 in the recess R111 is decreased, for example, to about 9,000 Angstrom, but the present disclosure is not limited thereto. It should be noted that since the device to be formed in the second region R2 may require lower cavity pressure or higher vacuum level (e.g. gyroscope), the outgassing layer 105' within the second region R2 is entirely removed in order to avoid the outgassing layer 105' to generate outgassing gas in the sealed device formed in the second region R2 in subsequent fabrication operations, which may deteriorate the device performance. Furthermore, dishing effect may be induced during performing CMP operation on the outgassing layer 105', therefore after the CMP operation, a top surface S105 of the outgassing material 105 in the recess R111 may be concaved toward the device substrate 101.

Figure 7:
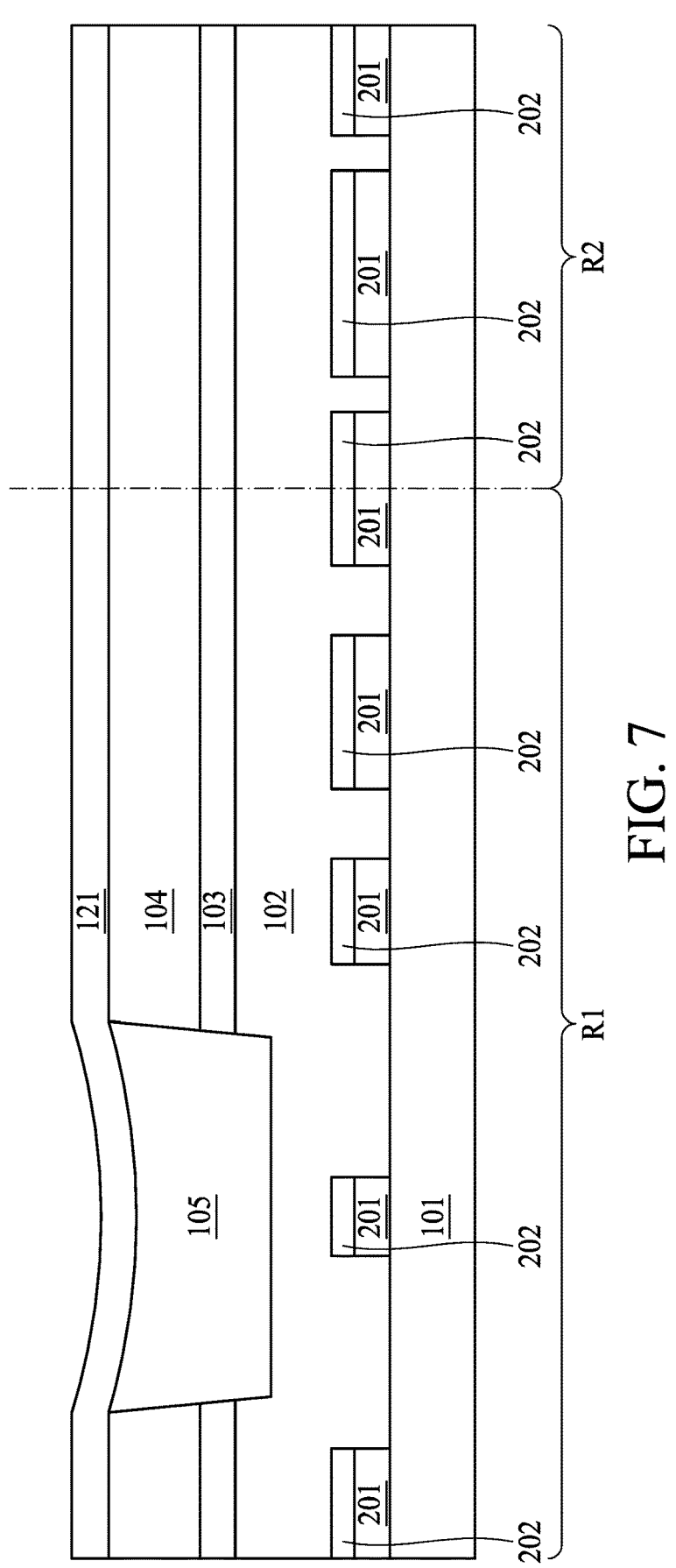

Referring to FIG. 7, FIG. 7 is a cross sectional view of a micro-electromechanical system structure during intermediate stages of manufacturing operations, according to some embodiments of the present disclosure. An outgassing barrier layer 121 is subsequently formed above the outgassing material 105 in the first region R1 and in the second region R2. The outgassing barrier layer 121 may be capable of hindering the permeation of outgassing gas generated by the outgassing material 105 and the passivation layer 111 (depending on the material of the passivation layer 111) from their top surface. In some embodiments, the outgassing barrier layer 121 may include nitride, such as silicon nitride (SiN), or other suitable barrier layers. The outgassing barrier layer 121 decrease the amount of outgassing gas released from the outgassing material 105 during the interval until the outgassing barrier layer 121 is removed, so the amount of outgassing gas released from the outgassing material 105 thereafter can be increased. Furthermore, in case some materials of the passivation layer 111 also generate gas under elevated temperature, the outgassing barrier layer 121 can limit the outgassing phenomena from the passivation layer 111, especially in the second region R2.

Figure 8:
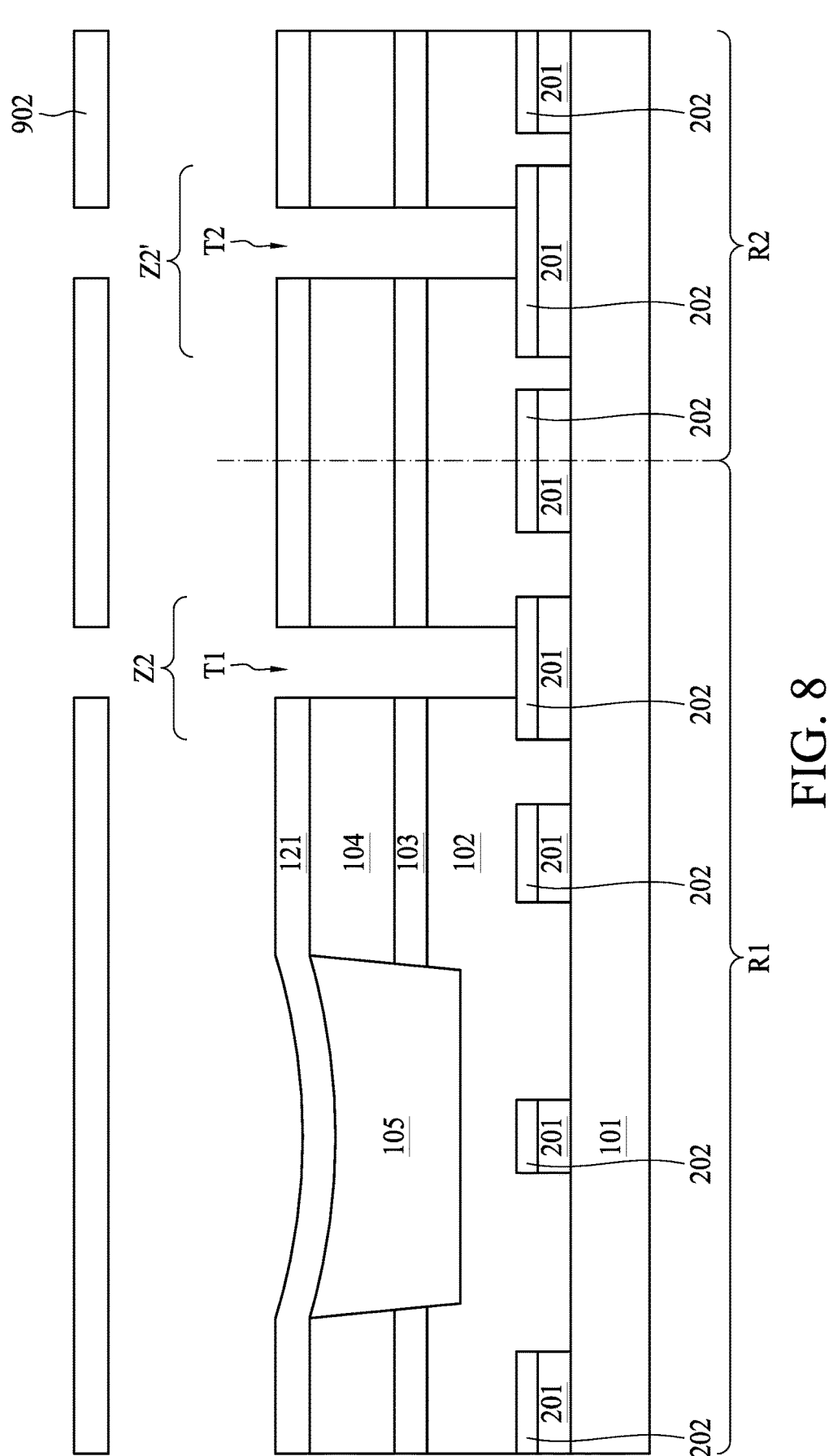

Referring to FIG. 8, FIG. 8 is a cross sectional view of a micro-electromechanical system structure during intermediate stages of manufacturing operations, according to some embodiments of the present disclosure. A trench T1 and a trench T2 are respectively formed in a first rerouting region Z2 and a second rerouting region Z2', thus a top surface of the titanium layer 202 is exposed. Herein the trench T1 and the trench T2 penetrates through the passivation layer 111 and the outgassing barrier layer 121. The trench T1 and the trench T2 may be formed by using a second mask 902, wherein the removal of the passivation layer 111 may entail photolithography operation and/or etching operation. For example, a critical dimension of the trench may be about 2 μm, but the present disclosure is not limited thereto.

Figure 9:
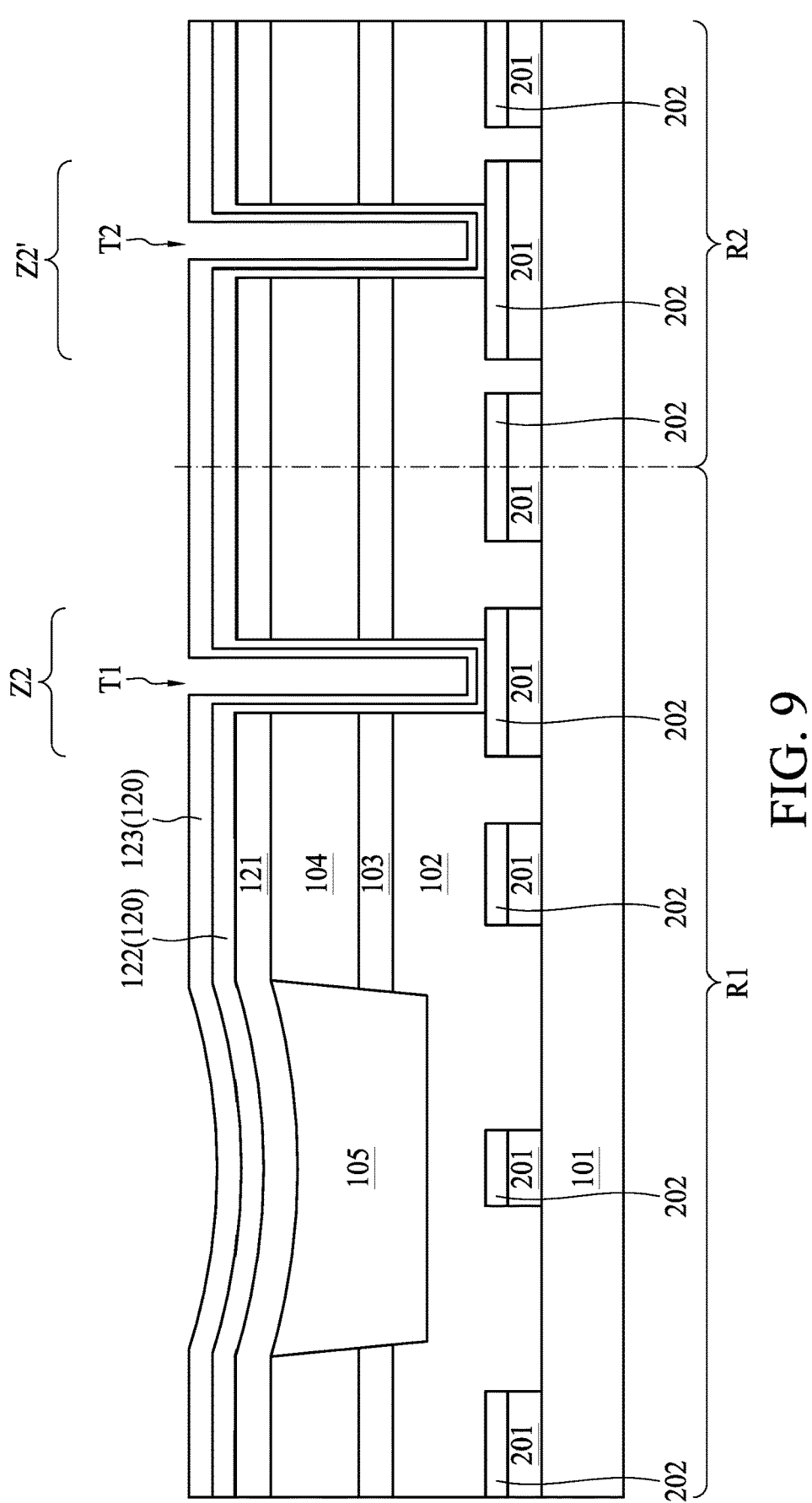

Referring to FIG. 9, FIG. 9 is a cross sectional view of a micro-electromechanical system structure during intermediate stages of manufacturing operations, according to some embodiments of the present disclosure. A rerouting layer 120 is formed above the outgassing barrier layer 121 and on a sidewall of the trench T1 in the first rerouting region Z2 and a sidewall of the trench T2 in the second rerouting region Z2'. Furthermore, the rerouting layer 120 directly contacts the exposed top surface of the titanium layer 202. Herein the rerouting layer 120 includes one or more conductive materials, such as metal. For example, the rerouting layer 120 may include a first layer 122 over the outgassing barrier layer 121 and directly contact with the exposed top surface of the titanium layer 202, a sidewall of the trench T1 and a sidewall of the trench T2, and a second layer 123 over the first layer 122. For example, the first layer 122 includes titanium, and the second layer includes titanium nitride (TiN).

Figure 10:
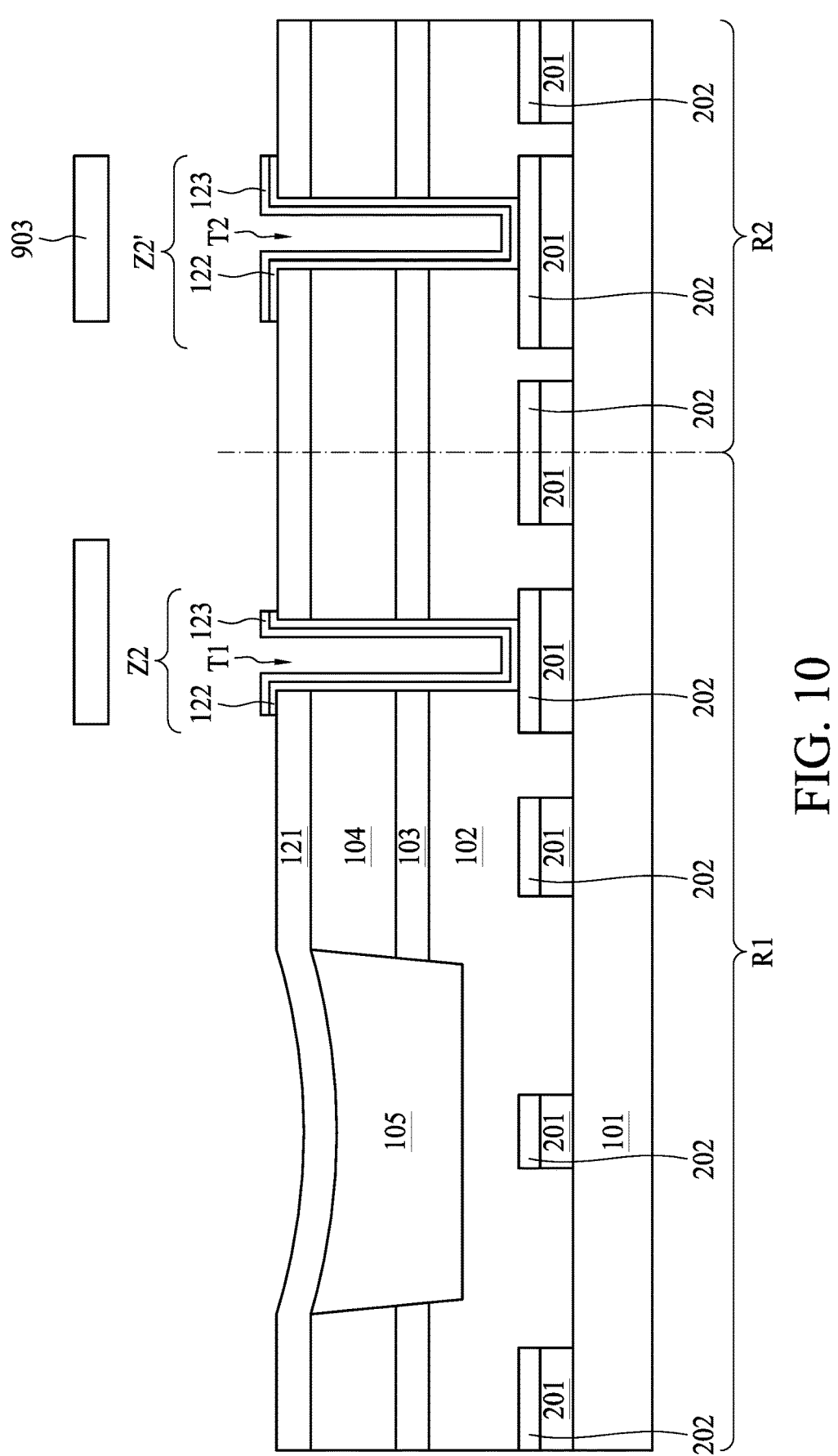

Referring to FIG. 10, FIG. 10 is a cross sectional view of a micro-electromechanical system structure during intermediate stages of manufacturing operations, according to some embodiments of the present disclosure. A portion of the rerouting layer 120 above the outgassing barrier layer 121 is removed by patterning with a third mask 903. The removal of the rerouting layer 120 may entail photolithography operation and/or etching operation.

Figure 11:
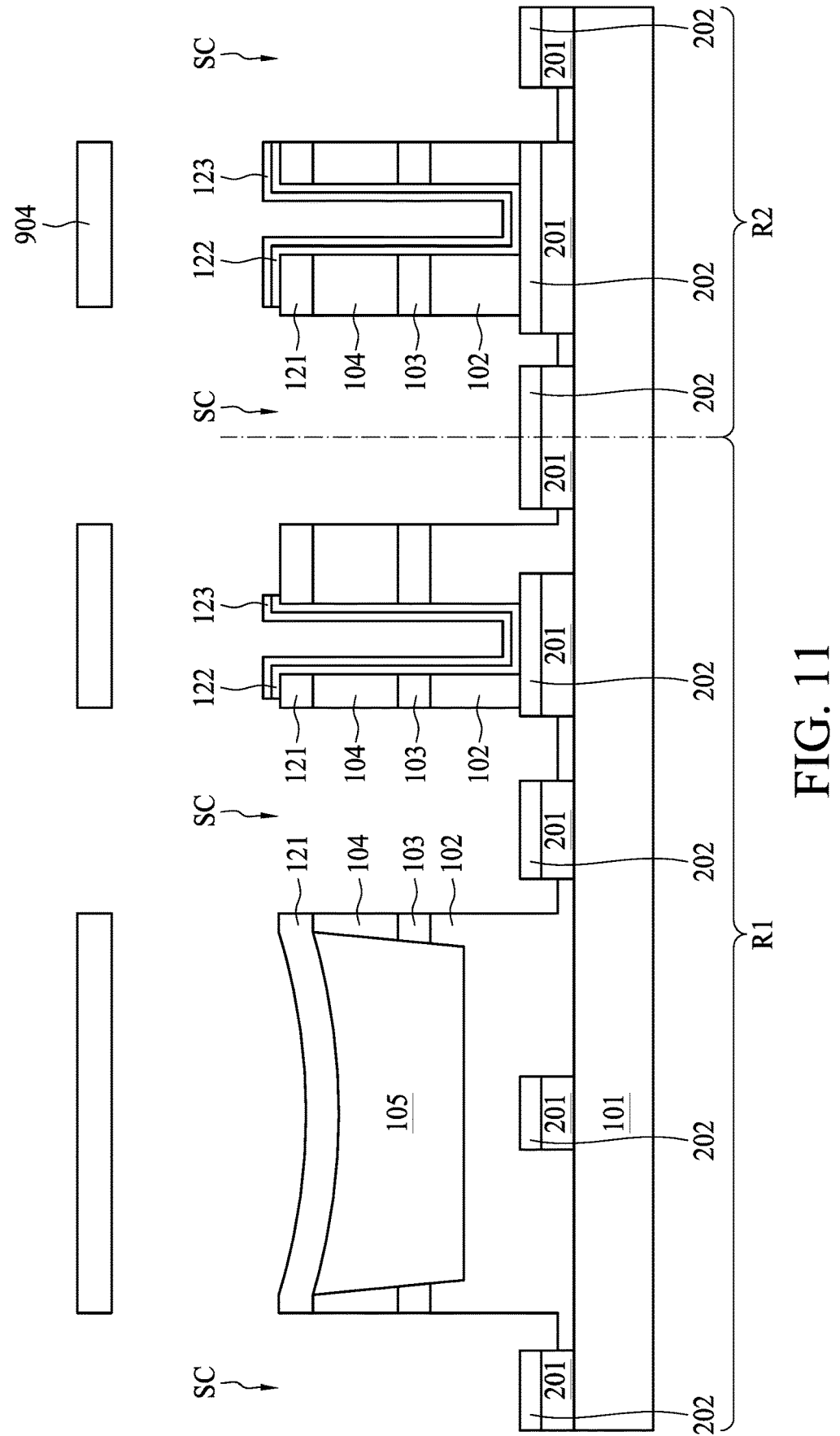

Referring to FIG. 11, FIG. 11 is a cross sectional view of a micro-electromechanical system structure during intermediate stages of manufacturing operations, according to some embodiments of the present disclosure. Some of the top metal lines 201 are not connected to the rerouting layer 120 and not directly under the outgassing material 105. The passivation layer 111 and the outgassing barrier layer 121 above such top metal lines 201 (neither connected to the rerouting layer 120 nor directly under the outgassing material 105) are removed in order to expose the entire top surface of the titanium layer 202, thereby forming a plurality of spaces SC above such titanium layer 202. In some embodiments, a bottom surface of the space SC is below a top surface of the top metal line 201 but above the top surface of the device substrate 101. The spaces SC can be formed by using a fourth mask 904 to remove a portion of the passivation layer 111 and a portion of the outgassing barrier layer 121, which may entail photolithography operation and/or etching operation.

Figure 12:
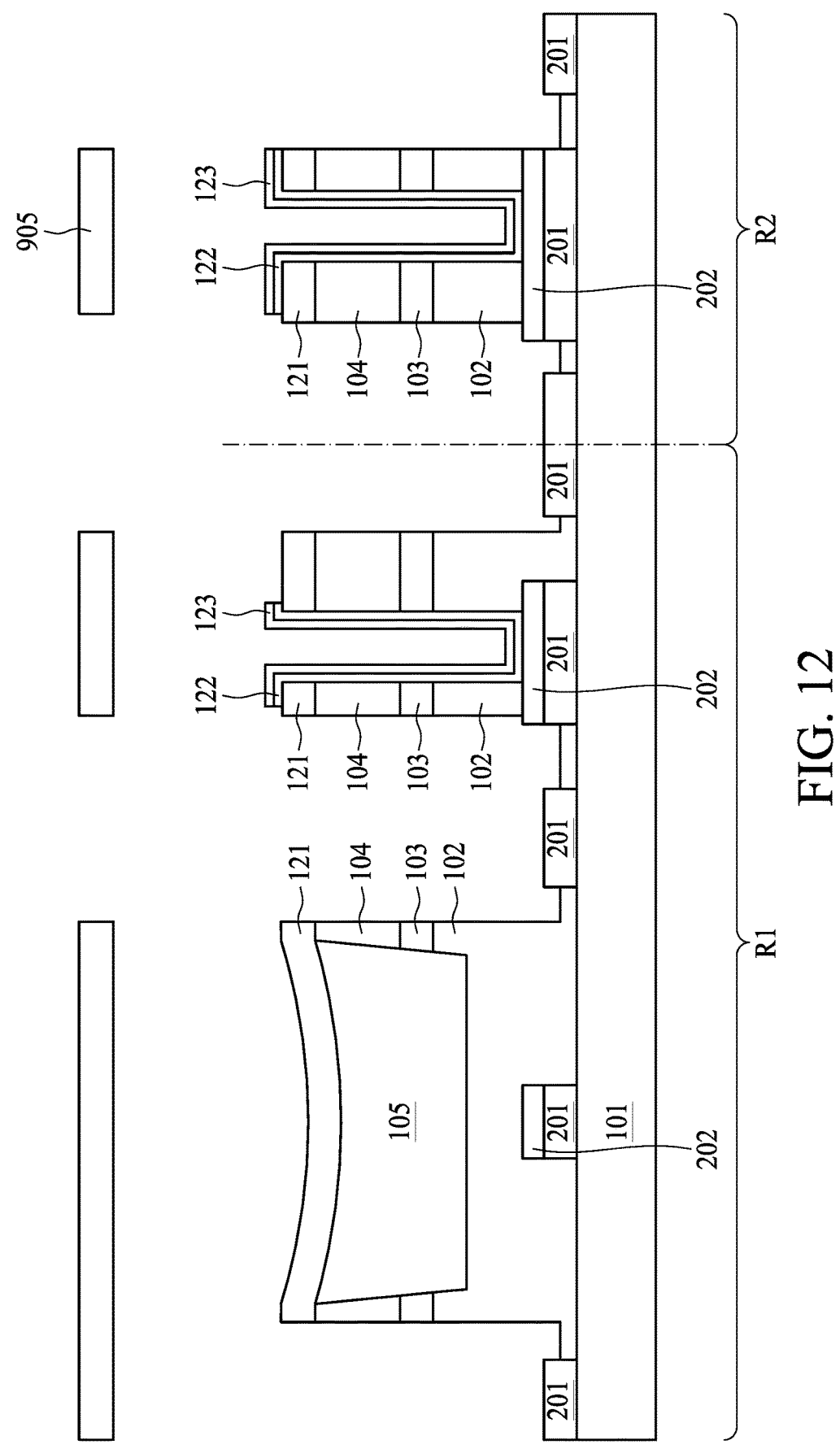

Referring to FIG. 12, FIG. 12 is a cross sectional view of a micro-electromechanical system structure during intermediate stages of manufacturing operations, according to some embodiments of the present disclosure. Subsequently, the titanium layer 202 exposed from the spaces SC are removed, wherein the removal operation may include photolithography operation and/or etching operation. Thereby some of the top metal lines 201 are exposed.

Referring to FIG. 2A to FIG. 2F, and FIG. 13A, FIG. 13A is a cross sectional view of a micro-electromechanical system structure during intermediate stages of manufacturing operations, according to some embodiments of the present disclosure. Subsequently, the outgassing material 105 and the outgassing barrier layer 121 are partially removed by patterning utilizing a sixth mask 906, wherein the removal operation may include photolithography operation and/or etching operation. Various of embodiments regarding with the shapes of the outgassing material 105 were previously discussed in FIG. 2A to FIG. 2F, wherein in some of the embodiments, at least one of the inner sidewall of the trench 1050 (e.g. FIG. 2A to FIG. 2F), a portion of the bottom surface RB of the recess (e.g. FIG. 2A, FIG. 2C, FIG. 2E or FIG. 2F), and/or a lower surface of the outgassing material 105 (e.g. FIG. 2B, FIG. 2D, FIG. 2E or FIG. 2F) is exposed. By partially remove the outgassing material 105, a total surface area of the outgassing material 105 increases and/or a portion of the outgassing material 105 proximal to the bottom surface of the recess R111 (as shown in FIG. 4) is exposed. Specifically, since the outgassing material 105 mostly generates outgassing gas at the surface area, the total exposed surface area is positively correlated to the outgassing rate of the outgassing gas generated by the outgassing material 105 in a given time period. Thereby, when the outgassing material 105 is heated to certain temperature in subsequent operations (e.g. bonding operation, as will be subsequently discussed in FIG. 15), the amount of the outgassing gas generated by the outgassing material 105 can be increased within a limited time period of such heating operation.

Figure 13B:
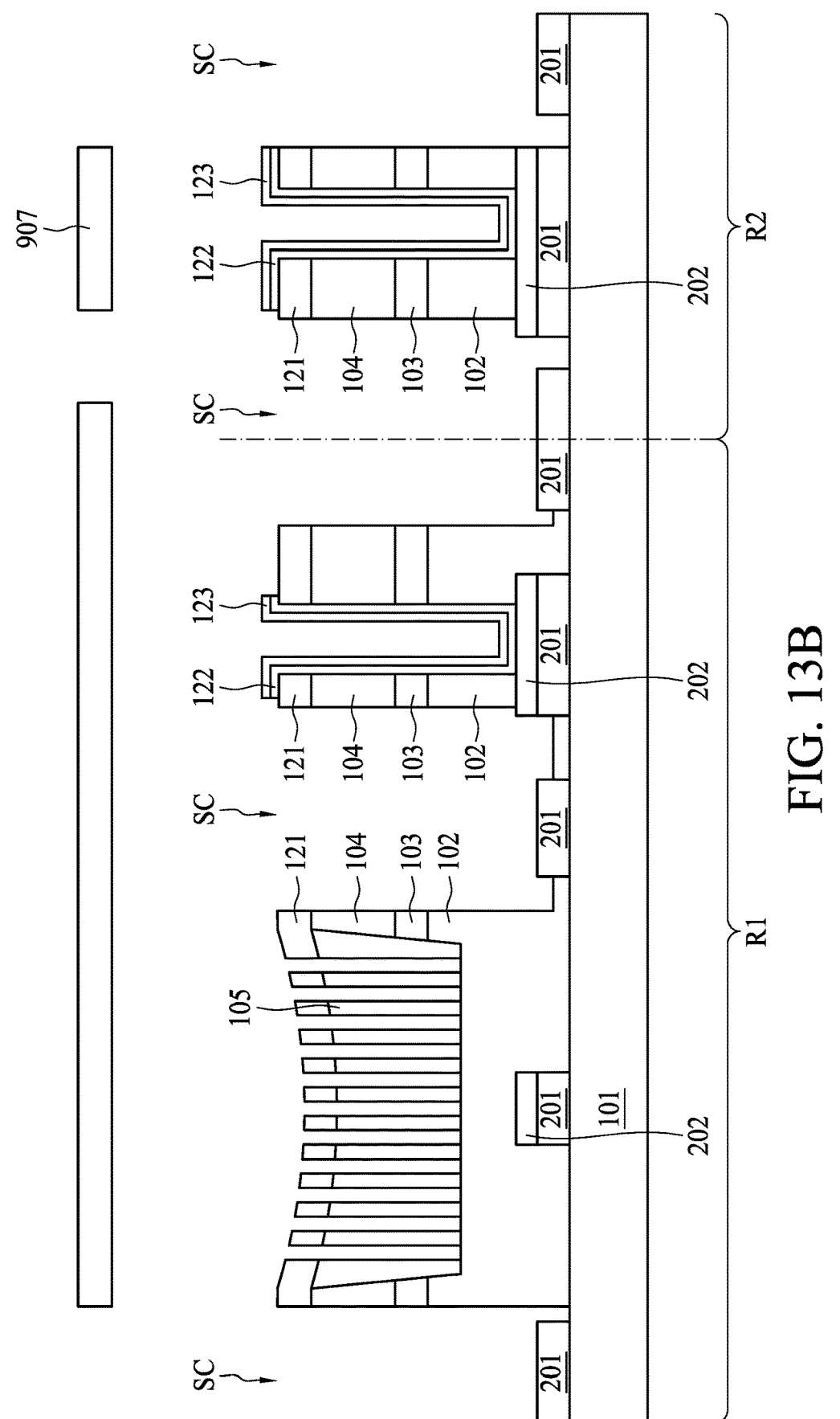
FIG. 13B to FIG. 13C are cross sectional views of a micro-electromechanical system structure during intermediate stages of manufacturing operations, according to some embodiments of the present disclosure.

Referring to FIG. 13B, FIG. 13B is a cross sectional view of a micro-electromechanical system structure during intermediate stages of manufacturing operations, according to some embodiments of the present disclosure. Some portions of the passivation layer 111 at the bottom of the spaces SC are further removed by patterning with a seventh mask 907. Since the passivation layer 111 may generate outgassing gas in some of the embodiments (depending on the material thereof), by further removing additional passivation layer 111, the amount of outgassing gas generated by the passivation layer 111 in subsequent operations can be decreased, especially in the sealed device in the second region R2. It should be noted that the sequence of performing the operations discussed in FIG. 13A and the operations discussed in FIG. 13B is not limited.

Figure 13C:
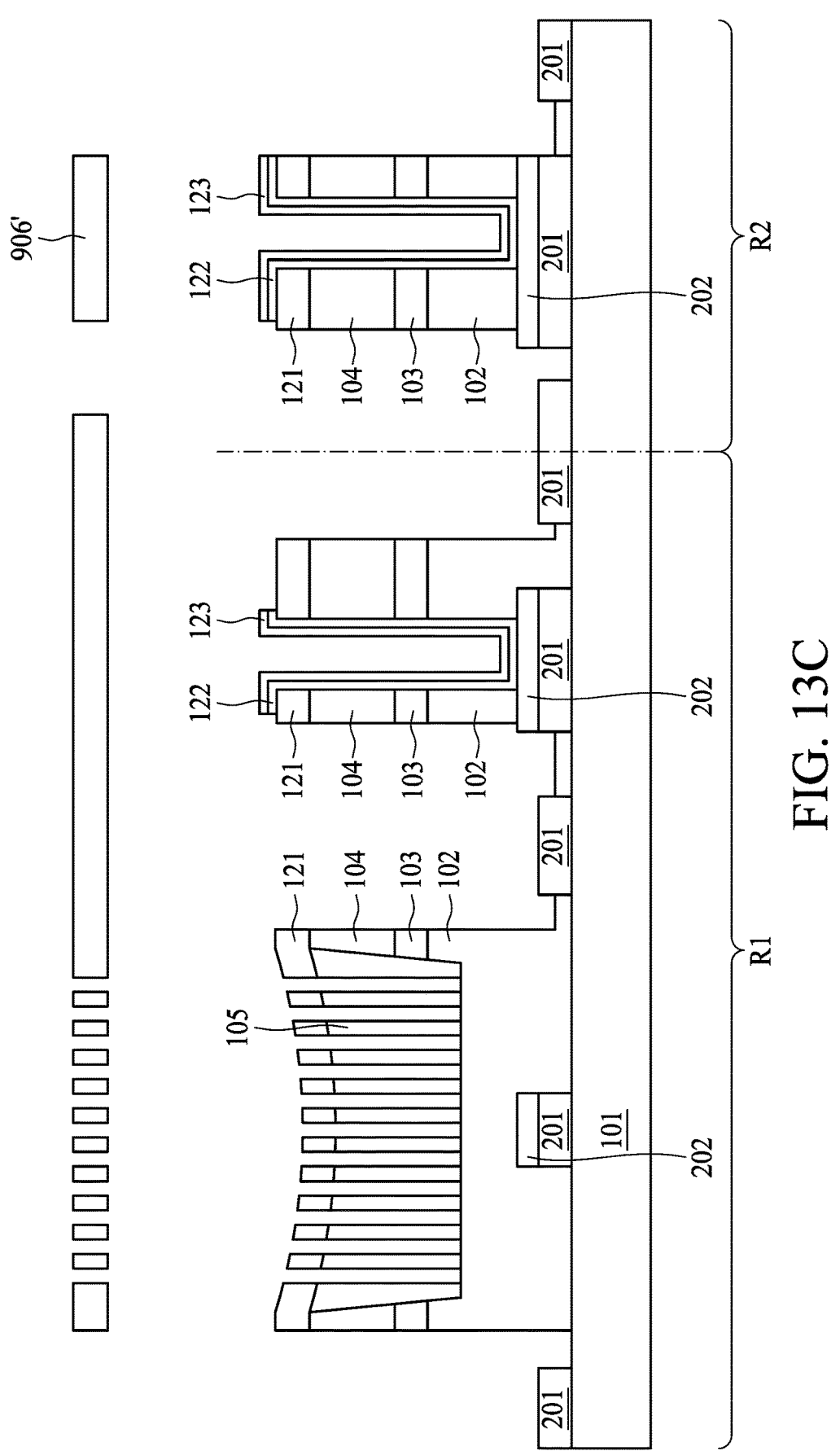

Referring to FIG. 13C, FIG. 13C is a cross sectional view of a micro-electromechanical system structure during intermediate stages of manufacturing operations, according to some embodiments of the present disclosure. Alternatively in some embodiment, the operation discussed in FIG. 13A and the operation discussed in FIG. 13B can be performed with a sixth mask 906' in order to facilitate fabrication efficiency. It should be noted that since a critical dimension of the removed portion of the outgassing material 105 (e.g. spacing a as discussed in FIG. 2A to FIG. 2D, or other critical dimensions discussed in FIG. 2A to FIG. 2F) is less than a critical dimension of the spaces SC, an etch rate at the outgassing material 105 may be lower than an etch rate at the bottom of the spaces SC when patterning with single sixth mask 906'.

Figure 14:
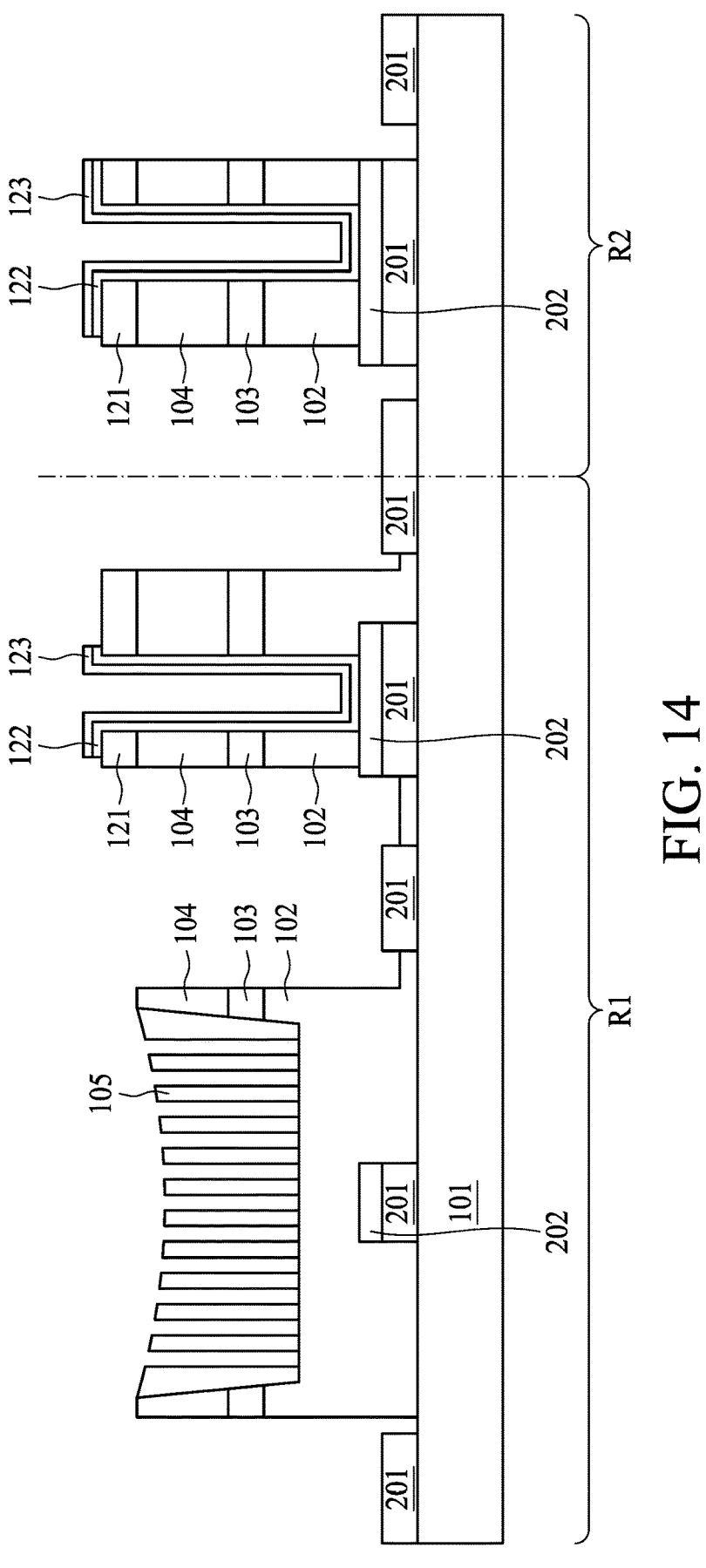
FIG. 14 to FIG. 15 are cross sectional views of a micro-electromechanical system structure during intermediate stages of manufacturing operations, according to some embodiments of the present disclosure.

Referring to FIG. 14, FIG. 14 is a cross sectional view of a micro-electromechanical system structure during intermediate stages of manufacturing operations, according to some embodiments of the present disclosure. Since some of the annealing operations (e.g. treatment on inter-metallic dielectric or inter-layer dielectric) may be performed prior to bonding the capping substrate 309 to the device substrate 101, the outgassing barrier layer 121 is removed subsequent to partially removing a portion of the outgassing material 105 (as previously discussed in FIG. 13A to FIG. 13B or FIG. 13C) thereby the outgassing material 105 is capable of outgassing during bonding operations, instead of substantially release most of the outgassing gas prior to bonding the device substrate 101 and the capping substrate 309, wherein the outgassing gas is not generated in a sealed cavity as intended. In some embodiments, the outgassing barrier layer 121 can be removed by blanket etch operation. In some embodiments, the outgassing barrier layer 121 in the first rerouting region Z2 and the second rerouting region Z2' are remained in order to hinder the passivation layers 111 from generating outgassing gas during subsequent bonding operation.

Figure 15:
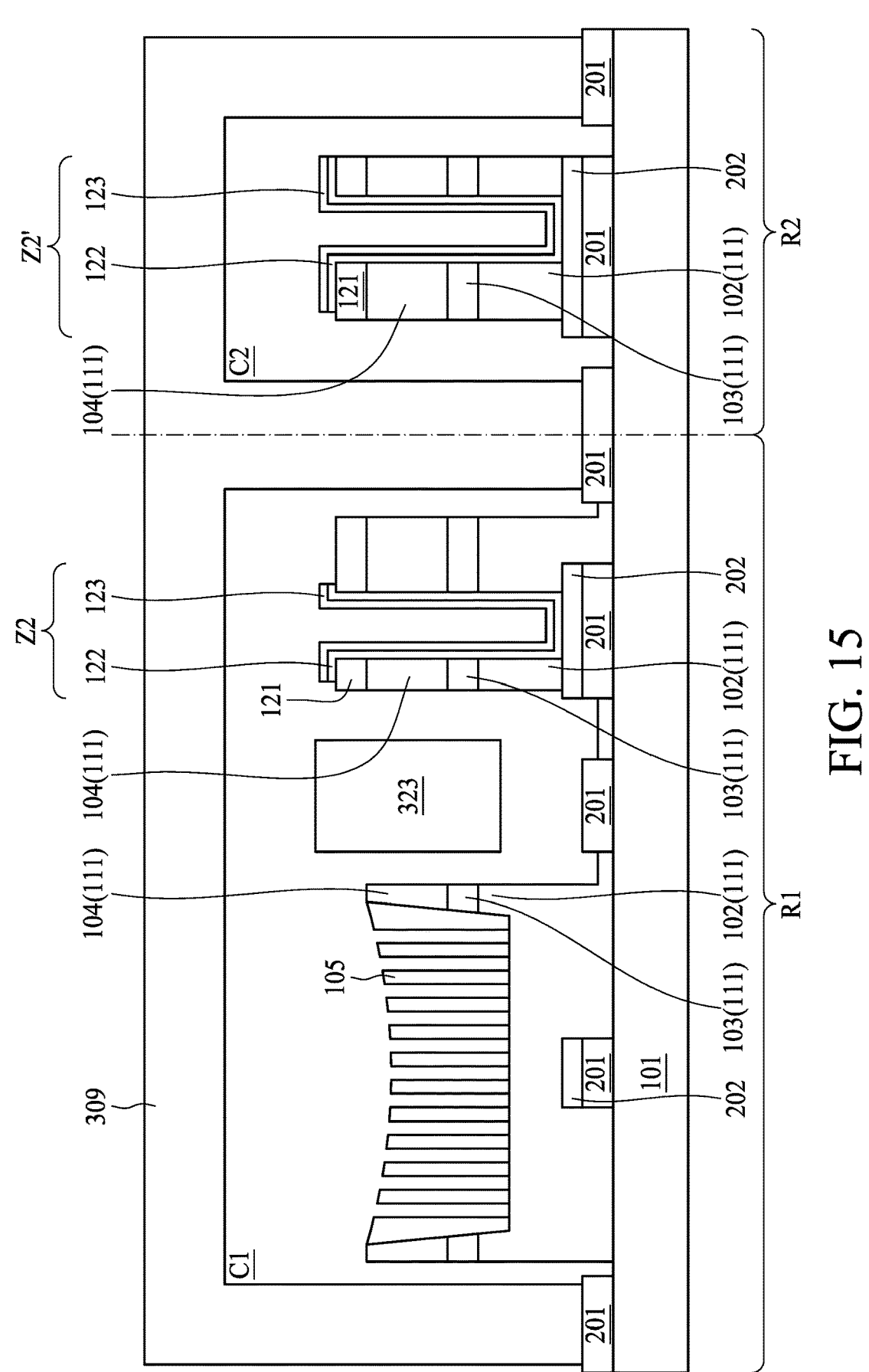

Referring to FIG. 15, FIG. 15 is a cross sectional view of a micro-electromechanical system structure during intermediate stages of manufacturing operations, according to some embodiments of the present disclosure. Subsequently the device substrate 101 is bonded to the capping substrate 309, wherein the bonding operation may include, but not limited to, eutectic bond (e.g. CuSn, AlGe, AuSi), fusion bond, thermo-compression, or any other suitable wafer-level bonding. For example, when the top metal lines 201 include aluminum copper, and a bonding area of the capping substrate 309 includes germanium, then an AlGe eutectic bond can be performed. It should be noted that the removal of titanium layer 202 as discussed in FIG. 12 can allow the top metal lines 201 to serve as a bonding pad and directly contact with the capping substrate 309, thereby facilitate the bonding adhesion force. By bonding the capping substrate 309 to the device substrate 101, the first cavity C1 and the second cavity C2 are respectively formed in the first region R1 and the second region R2. Since the bonding operation may be performed under a lowered-pressure environment, both the first cavity C1 and the second cavity C2 initially have lower cavity pressure (in some embodiments, high vacuum level). As previously discussed in FIG. 1, in order to individually increase the cavity pressure in the first cavity C1, the outgassing material 105 in the first cavity C1 generates outgassing gas during bonding operation.

Generally, the generation of outgassing gas from the outgassing material 105 may be stimulated by elevating temperature. During the bonding operation, a temperature of the device substrate 101 (including the first region R1 and the second region R2) and the capping substrate 309 is elevated. For the example of AlGe eutectic bonding operation, the temperature is elevated to at least 400° C., such as in a range from about 420° C. to about 440° C. Furthermore, in the embodiments of the outgassing material 105 including high density plasma (HDP) oxide, the outgassing material 105 may generate hydrogen gas ($H_2$), and in some embodiments further include Argon (Ar), which may stem from the deposition operation discussed in FIG. 5. However it should be noted that the type of the outgassing gas depends on the properties, the involved fabrication operations, and types of the outgassing material 105.

As previously discussed in FIG. 7 to FIG. 14, in order to generate greater amount of outgassing gas from the outgassing material 105 into the first cavity C1, specifically during the time interval of bonding operation, the outgassing barrier layer 121 is formed above the outgassing material 105 prior to rerouting operations, and subsequently removed before bonding operation as discussed in FIG. 15, thereby decrease the amount of outgassing gas released into environment instead of remained in the sealed first cavity C1. Furthermore, as discussed in FIG. 1 to FIG. 2F and FIG. 13A to FIG. 13C, since the outgassing material 105 mostly generates outgassing gas at the surface area, the total exposed surface area is positively correlated to the outgassing rate of the outgassing gas generated by the outgassing material 105 in a given time period. For example, during the bonding operation, the outgassing material 105 is elevated to over 400° C. for about a predetermined period of time (for example 10 minutes), and subsequently cooled down. By increasing the total exposed surface area (which is exposed to the first cavity C1 during bonding operation), the amount of generated outgassing gas can be increased within a limited time period of such heating operation. By partially remove the outgassing material 105, at least a sidewall or a lower surface below the top surface is exposed to the first cavity C1, wherein more outgassing gas can be generated at the surface of the outgassing material 105.

Subsequent to bonding the capping substrate 309 to the device substrate 101, the MEMs structure 100 is thereby formed, and the temperature of the MEMs structure 100 is lowered. Under a temperature lower than the bonding temperature, the amount of outgassing gas generated by the outgassing material 105 is substantially lowered.

In some embodiments, an accelerator is formed in the first region R1, wherein during the bonding operation, a movable component 323 (which may be a proof mass) is enclosed in the first cavity C1. In some embodiments, a gyroscope is formed in the second region, wherein the second cavity C2 has a cavity pressure lower than the first cavity C1. In some embodiments, the capping substrate 309 and the device substrate 101 may be singulated into a plurality of chips by dicing, and a device including the first cavity C1 and a device including the second cavity C2 are integrated in one integrated chip, so the integrated chip may be capable of performing multiple functions. It should be noted that the type of devices included in the MEMs structure 100 is not limited in the present disclosure.

Some embodiments of the present disclosure provide a micro electro mechanical system (MEMS) structure, including a device substrate having a first region and a second region different from the first region, a capping substrate bonded over the device substrate, a first cavity in the first region and between the device substrate and capping substrate, wherein the first cavity has a first cavity pressure, a second cavity in the second region and between the device substrate and capping substrate, wherein the second cavity has a second cavity pressure lower than the first cavity pressure, a passivation layer in the first cavity, an outgassing material over the passivation layer, wherein the outgassing material comprises a top surface and a sidewall exposed to the first cavity.

Some embodiments of the present disclosure provide a micro electro mechanical system (MEMS) structure, including a device substrate having a first region and a second region different from the first region, a capping substrate bonded over the device substrate, a first cavity in the first region and between the device substrate and the capping substrate, wherein the first cavity has a first cavity pressure, a second cavity in the second region and between the device substrate and the capping substrate, wherein the second cavity has a second cavity pressure lower than the first cavity pressure, a passivation layer in the first cavity, an outgassing material in the passivation layer, wherein the outgassing material comprises a trench, a depth of the trench being greater than 10% of a thickness of the outgassing material.

Some embodiments of the present disclosure provide a method for fabricating a semiconductor structure, including providing a device substrate, wherein the device substrate comprises a first region and a second region different from the first region, forming an outgassing material in the first region, partially removing a portion of the outgassing material to expose a sidewall of the outgas material, and bonding the device substrate to a capping substrate to form a first cavity in the first region and a second cavity in the second region.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A micro electro mechanical system (MEMS) structure, comprising:
   a device substrate having a first region and a second region different from the first region;
   a capping substrate bonded over the device substrate;
   a first cavity in the first region and between the device substrate and the capping substrate, wherein the first cavity has a first cavity pressure;
   a second cavity in the second region and between the device substrate and the capping substrate, wherein the second cavity has a second cavity pressure lower than the first cavity pressure;
   an outgassing material comprising a plurality of blocks and a first sidewall between adjacent blocks of the plurality of blocks and exposed to the first cavity, each of the plurality of blocks having a trench defined by a second sidewall; and
   a passivation layer disposed over the device substrate, wherein the passivation layer comprises an inner sidewall laterally surrounding an outgassing material, and wherein the first sidewall of the outgassing material extends from a top surface of the outgassing material to a top surface of the passivation layer.

2. The MEMS structure of claim 1, wherein the second sidewall connects to a bottom surface of the trench positioned between the top surface of the outgassing material and the top surface of the passivation layer.

3. The MEMS structure of claim 1, wherein a bottom surface of the trench is exposed to the first cavity.

4. The MEMS structure of claim 1, wherein a depth of the trench being less than or equal to a thickness of the outgassing material.

5. A micro electro mechanical system (MEMS) structure, comprising:
   a device substrate having a first region and a second region different from the first region;
   a capping substrate bonded over the device substrate;
   a first cavity in the first region and between the device substrate and capping substrate, wherein the first cavity has a first cavity pressure;
   a second cavity in the second region and between the device substrate and capping substrate, wherein the second cavity has a second cavity pressure lower than the first cavity pressure;
   an outgassing material, wherein the outgassing material comprises a top surface and a first sidewall exposed to the first cavity, wherein the outgassing material comprises a trench, a depth of the trench being less than or equal to a thickness of the outgassing material, and wherein the trench comprises a second sidewall defining the trench; and
   a passivation layer disposed over the device substrate, and is in direct contact with the outgassing material, wherein the first sidewall of the outgassing material extends from the top surface of the outgassing material to a top surface of the passivation layer.

6. The MEMS structure of claim 5, wherein the outgassing material comprises a material capable of generating substantial outgassing gas after undergoing a temperature for bonding the device substrate and the capping substrate.

7. The MEMS structure of claim 5, further comprising a movable component in the first cavity.

8. The MEMS structure of claim 5, wherein the top surface of the outgassing material concaves toward the device substrate.

9. The MEMS structure of claim 5, wherein the outgassing material comprises oxide.

10. The MEMS structure of claim 5, further comprising a recessed portion at the passivation layer, and the outgassing material is disposed in the recessed portion.

11. The MEMS structure of claim 10, wherein a bottom of the recessed portion is exposed to the first cavity from the outgassing material.

12. The MEMS structure of claim 10, wherein the outgassing material comprises a lower surface between the top surface and a bottom of the recessed portion, the lower surface is exposed to the first cavity.

13. A micro electro mechanical system (MEMS) structure, comprising:
   a device substrate having a first region and a second region adjacent to the first region;

a capping substrate bonded over the device substrate;

a first cavity in the first region and between the device substrate and capping substrate, wherein the first cavity has a first cavity pressure;

a second cavity in the second region and between the device substrate and capping substrate, wherein the second cavity has a second cavity pressure lower than the first cavity pressure;

an outgassing material, wherein the outgassing material comprises a plurality of protrusions protruding away from the device substrate, a top surface and a first sidewall exposed to the first cavity, the outgassing material is free from being in direct contact with the capping substrate; and a passivation layer disposed over the device substrate, and is in direct contact with the outgassing material, wherein the first sidewall of the outgassing material extends from the top surface of the outgassing material to a top surface of the passivation layer.

14. The MEMS structure of claim 13, wherein the passivation layer extends from the first region to the second region.

15. The MEMS structure of claim 13, further comprising an outgassing barrier layer in the first cavity.

16. The MEMS structure of claim 13, wherein the outgassing material partially covers the passivation layer such that a portion of the passivation layer is exposed to the first cavity.

17. The MEMS structure of claim 13, wherein each of the plurality of protrusions comprises a recess depressed from the top surface of the outgassing material.

18. The MEMS structure of claim 17, wherein the recess is defined by a second sidewall, the second sidewall being in connection to a bottom surface of the recess positioned between the top surface of the outgassing material and the top surface of the passivation layer.

19. The MEMS structure of claim 13, further comprising a metal line covered by the passivation layer.

20. The MEMS structure of claim 19, further comprising a rerouting layer connected to the metal line.

* * * * *